(12) United States Patent  
Klostermann et al.

(10) Patent No.: US 7,855,435 B2  
(45) Date of Patent: Dec. 21, 2010

(54) INTEGRATED CIRCUIT, METHOD OF MANUFACTURING AN INTEGRATED CIRCUIT, AND MEMORY MODULE

(75) Inventors: Ulrich Klostermann, Munich (DE); Rainer Leuschner, Regensburg (DE)

(73) Assignees: Qimonda AG (DE); Altis Semiconductor, SNC (FR)

( * ) Notice: Subject to any disclaimer, the term of this patent is extended or adjusted under 35 U.S.C. 154(b) by 264 days.

(21) Appl. No.: 12/047,167

(22) Filed: Mar. 12, 2008

(65) Prior Publication Data

US 2009/0230379 A1 Sep. 17, 2009

(51) Int. Cl.
*H01L 23/48* (2006.01)

(52) U.S. Cl. .......... 257/584; 257/527; 438/5; 438/296; 438/751

(58) Field of Classification Search .......... 257/3, 257/4, 5, 296, 751; 438/527, 584
See application file for complete search history.

(56) References Cited

U.S. PATENT DOCUMENTS

| | | | |
|---|---|---|---|
| 6,586,761 B2* | 7/2003 | Lowrey | 257/3 |
| 6,613,604 B2* | 9/2003 | Maimon et al. | 438/95 |
| 2002/0160551 A1* | 10/2002 | Harshfield | 438/102 |
| 2003/0096497 A1* | 5/2003 | Moore et al. | 438/652 |
| 2007/0210348 A1* | 9/2007 | Song et al. | 257/246 |
| 2008/0220560 A1* | 9/2008 | Klersy | 438/95 |

* cited by examiner

*Primary Examiner*—Fernando L Toledo

(57) ABSTRACT

According to one embodiment of the present invention, an integrated circuit including a plurality of memory cells is provided. Each memory cell includes a resistivity changing memory element which includes a top electrode, a bottom electrode, and resistivity changing material being disposed between the top electrode and the bottom electrode. Each resistivity changing memory element is at least partially surrounded by a thermal insulating structure. The thermal insulating structures are arranged such that the dissipation of heat generated within the resistivity changing memory elements into the environment of the resistivity changing memory elements is lowered.

13 Claims, 15 Drawing Sheets

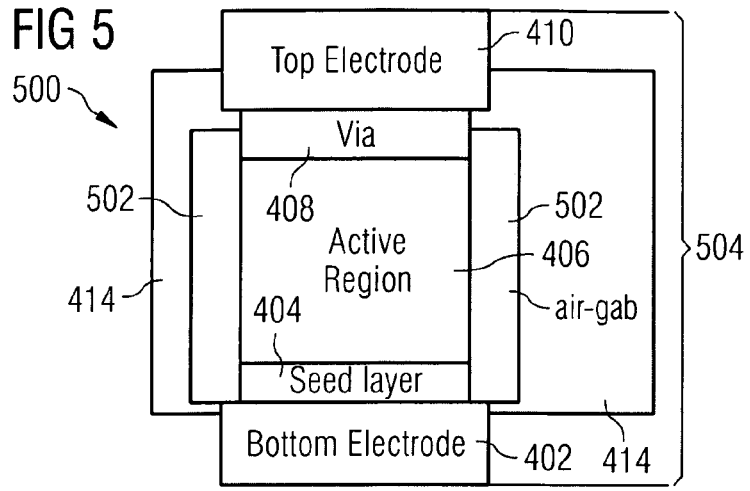
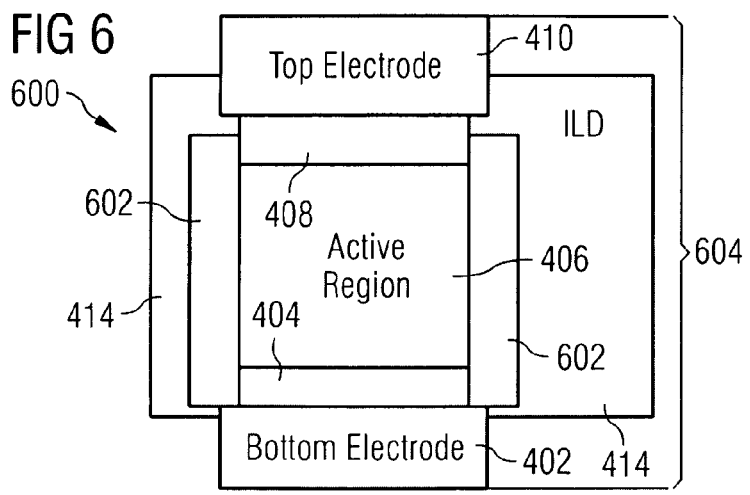
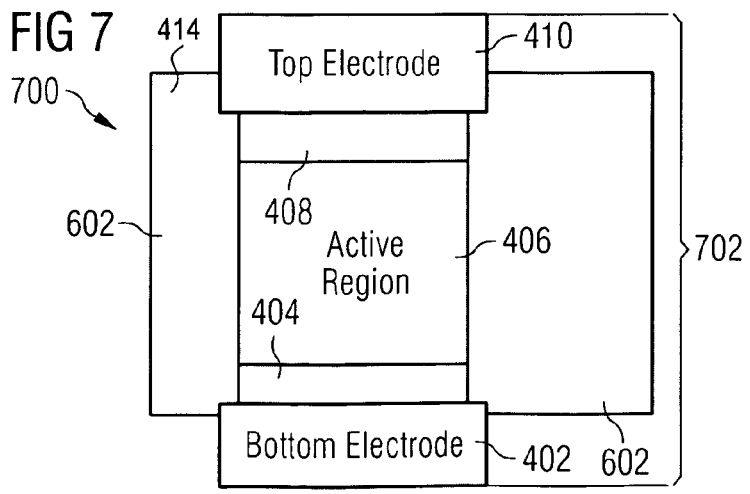

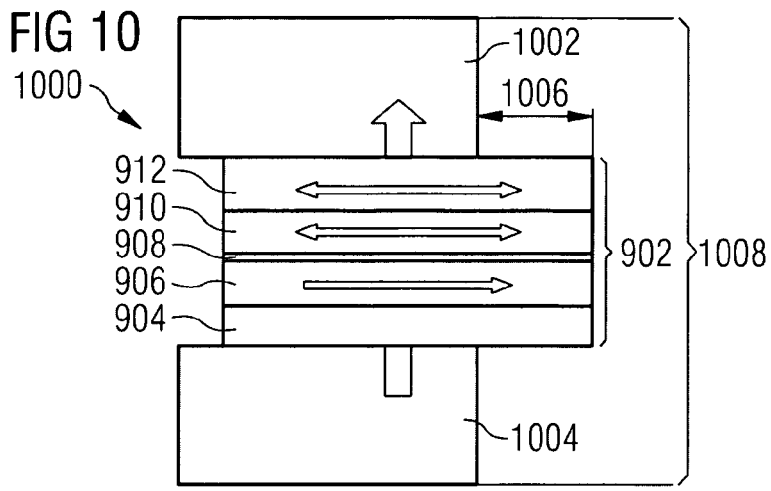
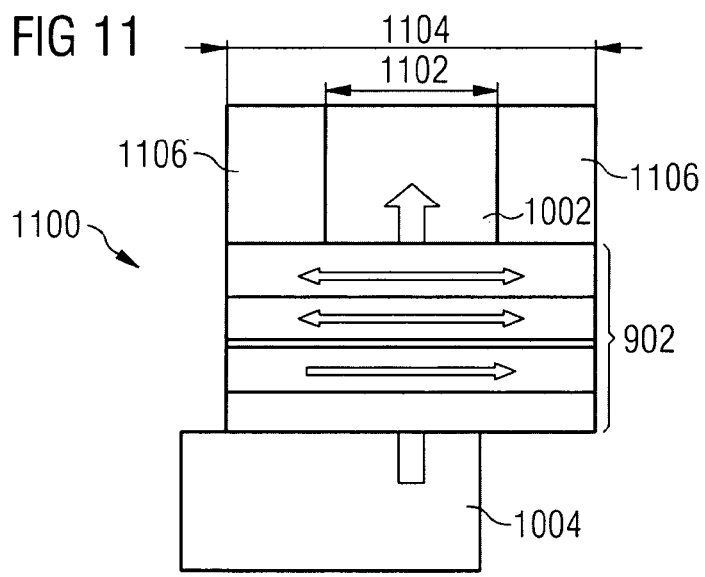
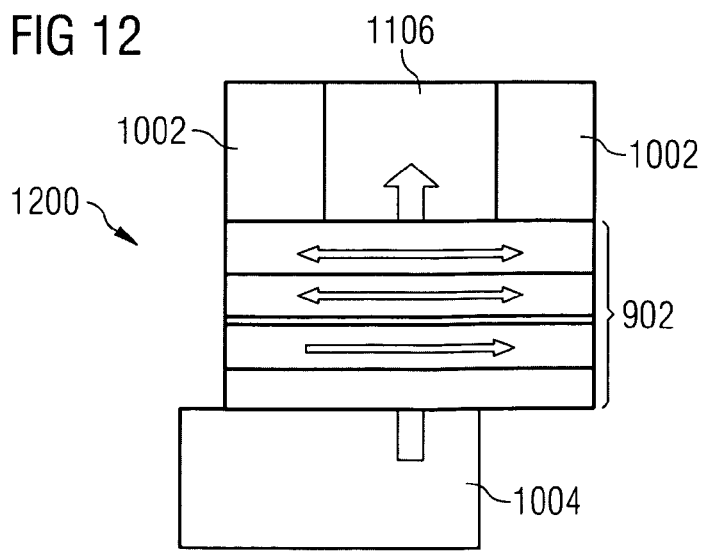

Deposition 1L spacer etch

Deposition 2L

CMP

SL etch

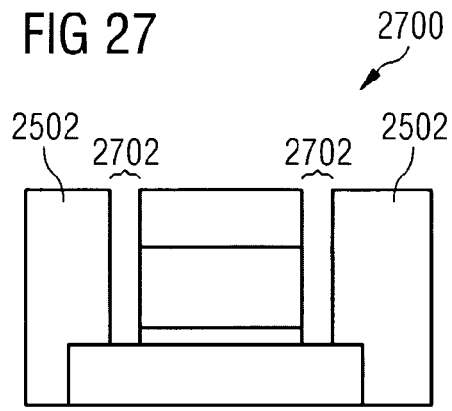
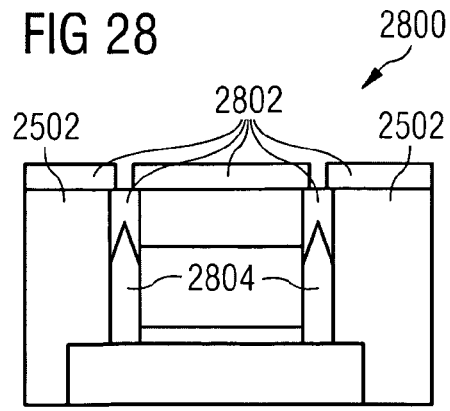
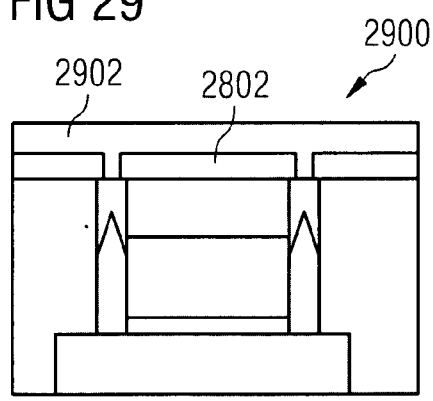
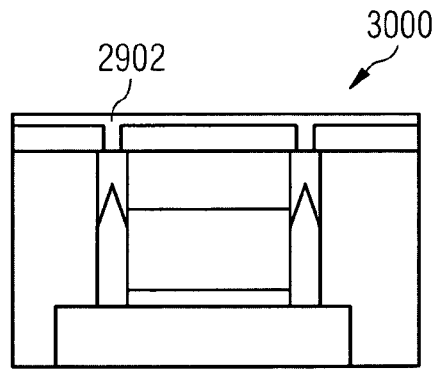
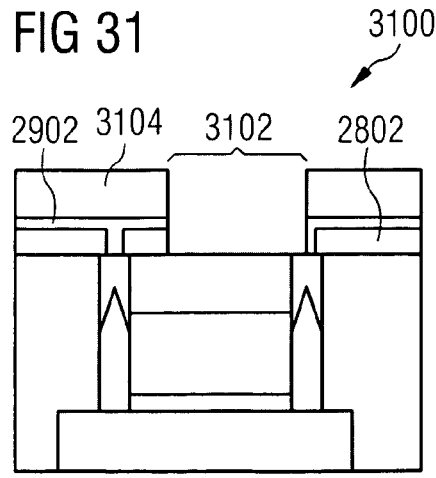

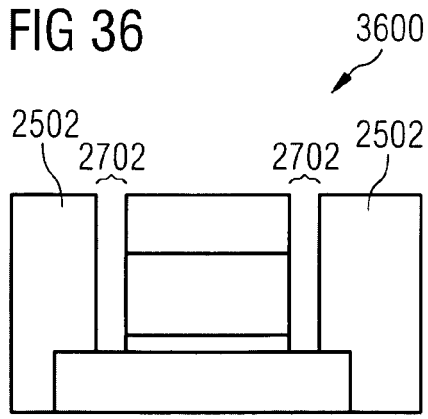
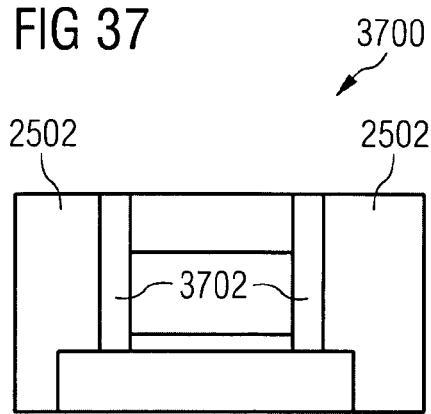
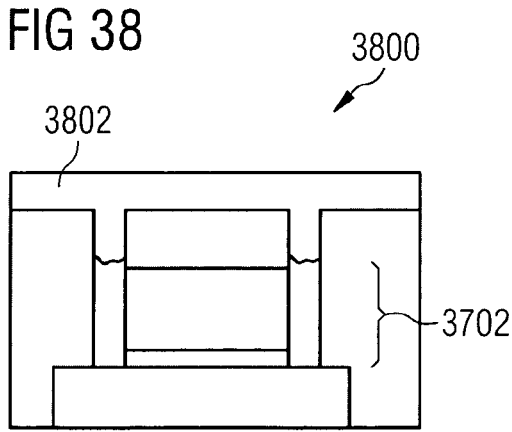
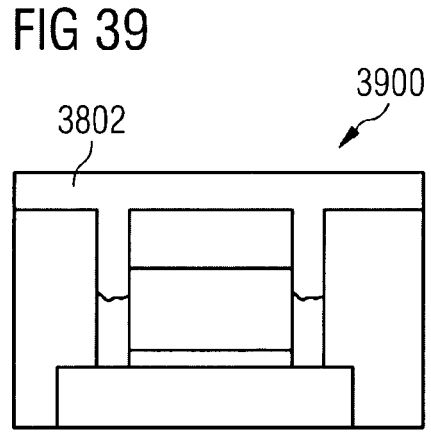
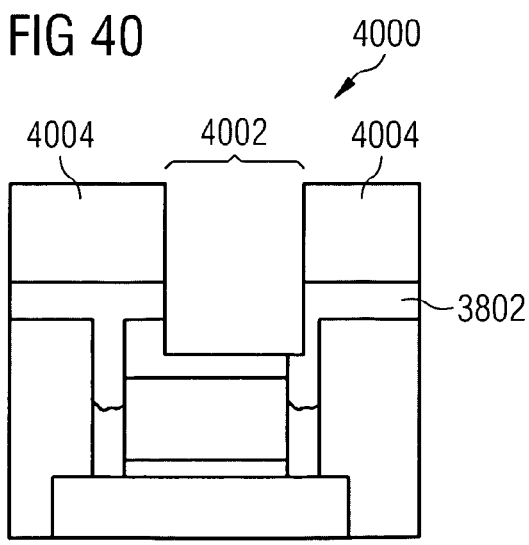

INTEGRATED CIRCUIT, METHOD OF MANUFACTURING AN INTEGRATED CIRCUIT, AND MEMORY MODULE

BACKGROUND

Integrated circuits including memory cells are known. It is desirable to improve the performance of such integrated circuits.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 5 shows a schematic cross-sectional view of a part of a thermal select magneto-resistive memory cell of an integrated circuit according to one embodiment;

FIG. 6 shows a schematic cross-sectional view of a part of a thermal select magneto-resistive memory cell of an integrated circuit according to one embodiment;

FIG. 7 shows a schematic cross-sectional view of a part of a thermal select magneto-resistive memory cell of an integrated circuit according to one embodiment;

FIG. 10 shows a schematic cross-sectional view of a part of a thermal select magneto-resistive memory cell according to one embodiment;

FIG. 11 shows a schematic cross-sectional view of a part of a thermal select magneto-resistive memory cell according to one embodiment;

FIG. 12 shows a schematic cross-sectional view of a part of a thermal select magneto-resistive memory cell according to one embodiment;

FIG. 27 shows a schematic cross-sectional view of a manufacturing stage of a method of manufacturing an integrated circuit according to one embodiment;

FIG. 28 shows a schematic cross-sectional view of a manufacturing stage of a method of manufacturing an integrated circuit according to one embodiment;

FIG. 29 shows a schematic cross-sectional view of a manufacturing stage of a method of manufacturing an integrated circuit according to one embodiment;

FIG. 30 shows a schematic cross-sectional view of a manufacturing stage of a method of manufacturing an integrated circuit according to one embodiment;

FIG. 31 shows a schematic cross-sectional view of a manufacturing stage of a method of manufacturing an integrated circuit according to one embodiment;

FIG. 36 shows a schematic cross-sectional view of a manufacturing stage of a method of manufacturing an integrated circuit according to one embodiment;

FIG. 37 shows a schematic cross-sectional view of a manufacturing stage of a method of manufacturing an integrated circuit according to one embodiment;

FIG. 38 shows a schematic cross-sectional view of a manufacturing stage of a method of manufacturing an integrated circuit according to one embodiment;

FIG. 39 shows a schematic cross-sectional view of a manufacturing stage of a method of manufacturing an integrated circuit according to one embodiment;

FIG. 40 shows a schematic cross-sectional view of a manufacturing stage of a method of manufacturing an integrated circuit according to one embodiment;

DETAILED DESCRIPTION OF ILLUSTRATIVE EMBODIMENTS

Figure 1:
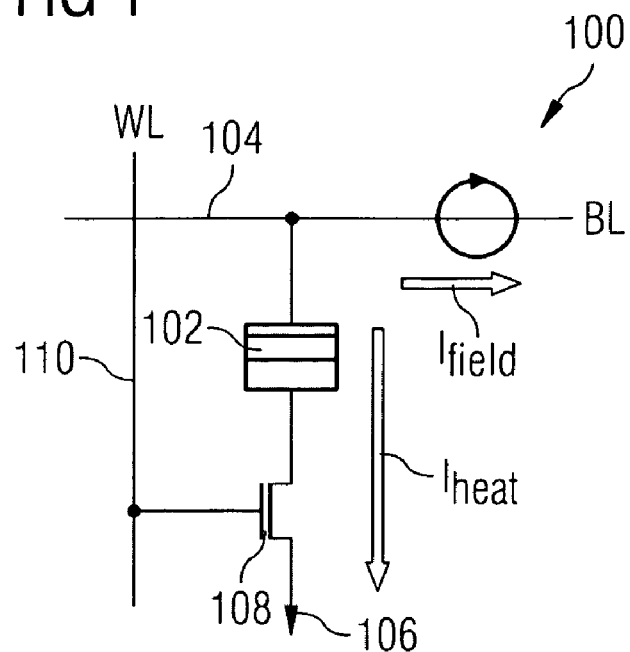
FIG. 1 shows a schematic view of a part of an integrated circuit including thermal select magneto-resistive memory cells according to one embodiment.

According to one embodiment of the present invention, an integrated circuit comprising a plurality of memory cells is provided, each memory cell including a resistivity changing memory element which includes a top electrode, a bottom electrode, and resistivity changing material being disposed between the top electrode and the bottom electrode, wherein each resistivity changing memory element is at least partially surrounded by a thermal insulating structure.

According to one embodiment of the present invention, the thermal insulating structures are arranged such that the dissipation of heat generated within the resistivity changing memory elements into the environment of the resistivity changing memory elements is lowered.

According to one embodiment of the present invention, the thermal insulating structures are arranged such that the strengths of heating currents which are driven through the resistivity changing memory elements before switching the memory states of the resistivity changing memory elements can be decreased.

According to one embodiment of the present invention, the thermal insulating structures are arranged such that the time period during which a switching of the memory states of the resistivity changing memory elements is possible after having driven heating currents through the resistivity changing memory elements can be increased.

According to one embodiment of the present invention, the lateral dimensions of the top electrodes are lower than the lateral dimensions of parts of the resistivity changing memory elements located below the top electrodes, or the lateral dimensions of the bottom electrodes are lower than the lateral dimensions of parts of the resistivity changing memory elements located above the bottom electrodes.

According to one embodiment of the present invention, the thermal insulating structures cover at least a part of the top surfaces of material layers of the resistivity changing memory elements which are contacted by the top electrodes, or cover at least a part of the bottom surfaces of material layers of the resistivity changing memory elements which are contacted by the bottom electrodes.

According to one embodiment of the present invention, the thermal insulating structures surround at least a part of the side surfaces of the top electrodes, or surround at least a part of the side surfaces of the bottom electrodes.

According to one embodiment of the present invention, the lateral dimensions of the top electrodes or of the bottom electrodes are lower than 1 F.

According to one embodiment of the present invention, the thermal insulating structures cover at least a part of the side surfaces of the resistivity changing memory elements.

According to one embodiment of the present invention, the thermal insulating structures include or consist of air gaps.

According to one embodiment of the present invention, the thermal insulating structures include or consist of insulating material.

According to one embodiment of the present invention, the thermal insulating structures include or consist of low-k material.

According to one embodiment of the present invention, the space between the thermal isolation structures of different resistivity changing memory elements is filled with an inter layer dielectric.

According to one embodiment of the present invention, the resistivity changing memory elements are thermal select magneto-resistive memory elements.

According to one embodiment of the present invention, the resistivity changing memory elements are phase changing memory elements.

According to one embodiment of the present invention, an integrated circuit including a plurality of memory cells is provided, each memory cell including a resistivity changing memory element which includes a top electrode, a bottom electrode, and resistivity changing material being disposed between the top electrode and the bottom electrode, wherein the space between different resistivity changing memory elements is filled with thermal insulating material.

According to one embodiment of the present invention, a method of manufacturing an integrated circuit is provided, the method including forming a plurality of memory cells, each memory cell including a resistivity changing memory element which includes a top electrode, a bottom electrode, and resistivity changing material being disposed between the top electrode and the bottom electrode, wherein the integrated circuit is manufactured such that each resistivity changing memory element is at least partially surrounded by a thermal insulating structure.

According to one embodiment of the present invention, a stack of layers including a resistivity changing material layer is formed; the stack of layers is patterned into a plurality of resistivity changing memory element stacks; a plurality of spacers is formed, each spacer covering the side walls of one resistivity changing memory element stack; the space between different spacers is filled with insulating material; and the spacers are removed in order to generate trenches between the resistivity changing memory elements and the insulating material.

According to one embodiment of the present invention, liquid material is filled into at least the lower parts of the trenches; the upper parts of the trenches are filled with trench filling material; and a temperature treatment is carried out which causes the liquid material to diffuse out of the trenches.

According to one embodiment of the present invention, the upper parts of the trenches are filled with trench filling material using a non-conformal deposition process.

According to one embodiment of the present invention, the following processes are carried out: forming a stack of layers including a resistivity changing material layer; forming a sacrificial layer on the stack of layers; patterning the sacrificial layer in order to form a contact hole; depositing a first layer on the patterned surface of the sacrificial layer; removing a part of the first layer covering the top surface of the stack of layers, and depositing a second layer on the patterned surface of the sacrificial layer such that the contact hole is filled with second layer material.

According to one embodiment of the present invention, the first layer includes or consists of insulating material, and the second layer includes or consists of conductive material, or vice versa.

According to one embodiment of the present invention, the following processes are carried out: removing the first layer and the second layer until the top surface of the sacrificial layer is exposed; removing the sacrificial layer; and using the remaining parts of the first layer and the second layer as a mask for patterning the stack of layers.

According to one embodiment of the present invention, a spacer is formed after having already patterned an upper part of the stack, wherein the spacer covers the side surfaces of the first layer, and wherein the structure thus obtained is used as a mask for patterning the stack of layers which has not been patterned so far.

According to one embodiment of the present invention, a memory module including at least one integrated circuit is provided, the integrated circuit including a plurality of memory cells, each memory cell including a resistivity changing memory element which includes a top electrode, a bottom electrode, and resistivity changing material being disposed between the top electrode and the bottom electrode, wherein the space between different resistivity changing memory elements is filled with thermal insulating material.

According to one embodiment of the present invention, the memory cells are magneto-resistive memory cells. Therefore, in the following description, possible examples of embodiments of magneto-resistive memory cells will be described. Magneto-resistive memory cells involve spin electronics, which combines semiconductor technology and magnetics. The spin of an electron, rather than the charge, is used to indicate the presence of a "1" or "0". One such spin electronic device is a magnetic random-access memory (MRAM), which includes conductive lines positioned perpendicular to one another in different metal layers, the conductive lines sandwiching a magnetic stack. The place where the conductive lines intersect is called a cross-point. A current flowing through one of the conductive lines generates a magnetic field around the conductive line and orients the magnetic polarity into a certain direction along the wire or conductive line. A current flowing through the other conductive line induces the magnetic field and can also partially turn the magnetic polarity. Digital information, represented as a "0" or "1" is stored in the alignment of magnetic moments. The resistance of the magnetic component depends on the moment's alignment. The stored state is read from the element by detecting the component's resistive state. A memory cell may be constructed by placing the conductive lines and cross-points in a matrix structure or array having rows and columns.

Figure 41:
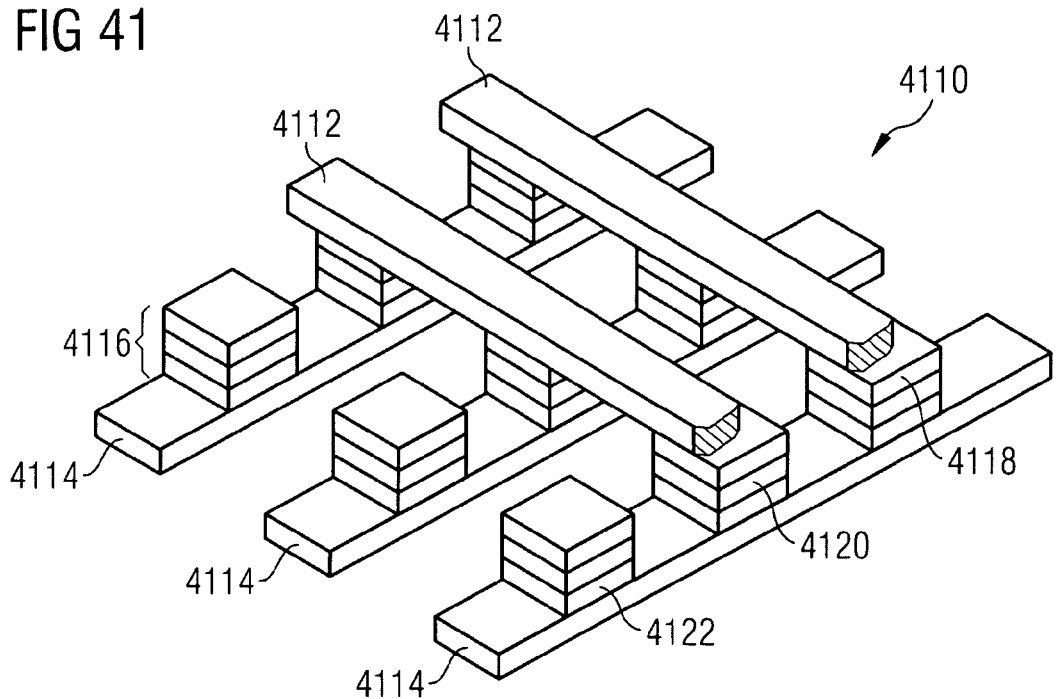
FIG. 41 shows a schematic perspective view of an integrated circuit including magneto-resistive memory cells according to one embodiment.

FIG. 41 illustrates a perspective view of a MRAM device 4110 having bit lines 4112 located orthogonal to word lines 4114 in adjacent metallization layers. Magnetic stacks 4116 are positioned between the bit lines 4112 and word lines 4114 adjacent and electrically coupled to bit lines 4112 and word lines 4114. Magnetic stacks 4116 preferably include multiple layers, including a soft layer 4118, a tunnel layer 4120, and a hard layer 4122, for example. Soft layer 4118 and hard layer 4122 preferably include a plurality of magnetic metal layers, for example, eight to twelve layers of materials such as PtMn, CoFe, Ru, and NiFe, as examples. A logic state is storable in the soft layer 4118 of the magnetic stacks 4116 located at the junction of the bitlines 4112 and word lines 4114 by running a current in the appropriate direction within the bit lines 4112 and word lines 4114 which changes the resistance of the magnetic stacks 4116.

Figure 42:
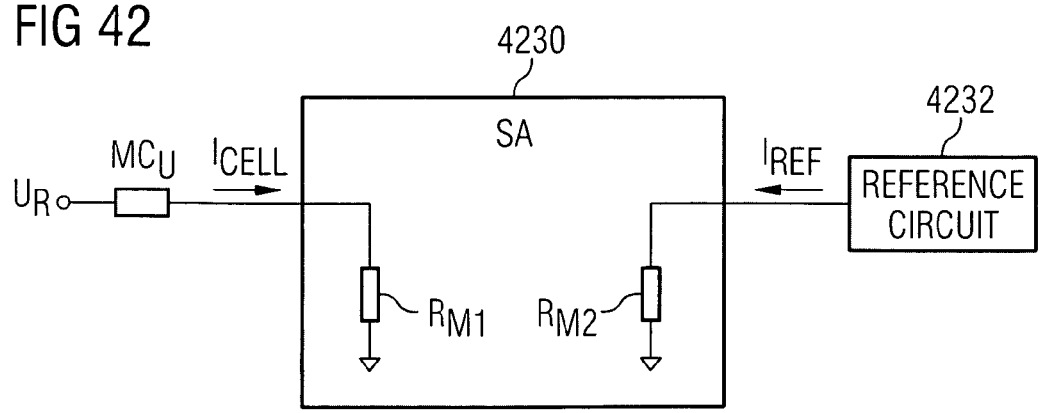
FIG. 42 shows a circuit usable in conjunction with the integrated circuit shown in FIG. 41.

In order to read the logic state stored in the soft layer 4118 of the magnetic stack 4116, a schematic such as the one shown in FIG. 42, including a sense amplifier (SA) 4230, is used to determine the logic state stored in an unknown memory cell MCu. A reference voltage $U_R$ is applied to one end of the unknown memory cell MCu. The other end of the unknown memory cell MCu is coupled to a measurement resistor $R_{m1}$. The other end of the measurement resistor $R_{m1}$ is coupled to ground. The current running through the unknown memory cell MCu is equal to current $I_{cell}$. A reference circuit 4232 supplies a reference current $I_{ref}$ that is run into measurement resistor $R_{m2}$. The other end of the measurement resistor $R_{m2}$ is coupled to ground, as shown.

According to one embodiment of the present invention, the memory cells are phase changing memory cells. Therefore, in the following description, possible examples of embodiments of phase changing memory cells will be described. Phase changing memory cells include a phase changing material. The phase changing material can be switched between at least two different crystallization states (i.e., the phase changing material may adopt at least two different degrees of crystallization), wherein each crystallization state may be used to represent a memory state. When the number of possible crystallization states is two, the crystallization state having a high degree of crystallization is also referred to as a "crystalline state", whereas the crystallization state having a low degree of crystallization is also referred to as an "amorphous state". Different crystallization states can be distinguished from each other by their differing electrical properties, and in particular by their different resistances. For example, a crystallization state having a high degree of crystallization (ordered atomic structure) generally has a lower resistance than a crystallization state having a low degree of crystallization (disordered atomic structure). For sake of simplicity, it will be assumed in the following that the phase changing material can adopt two crystallization states (an "amorphous state" and a "crystalline state"), however it will be understood that additional intermediate states may also be used.

Phase changing memory cells may change from the amorphous state to the crystalline state (and vice versa) due to temperature changes of the phase changing material. These temperature changes may be caused using different approaches. For example, a current may be driven through the phase changing material (or a voltage may be applied across the phase changing material). Alternatively, a current or a voltage may be fed to a resistive heater which is disposed adjacent to the phase changing material. To determine the memory state of a resistivity changing memory cell, a sensing current may routed through the phase changing material (or a sensing voltage may be applied across the phase changing material), thereby sensing the resistivity of the resistivity changing memory cell, which represents the memory state of the memory cell.

Figure 44:
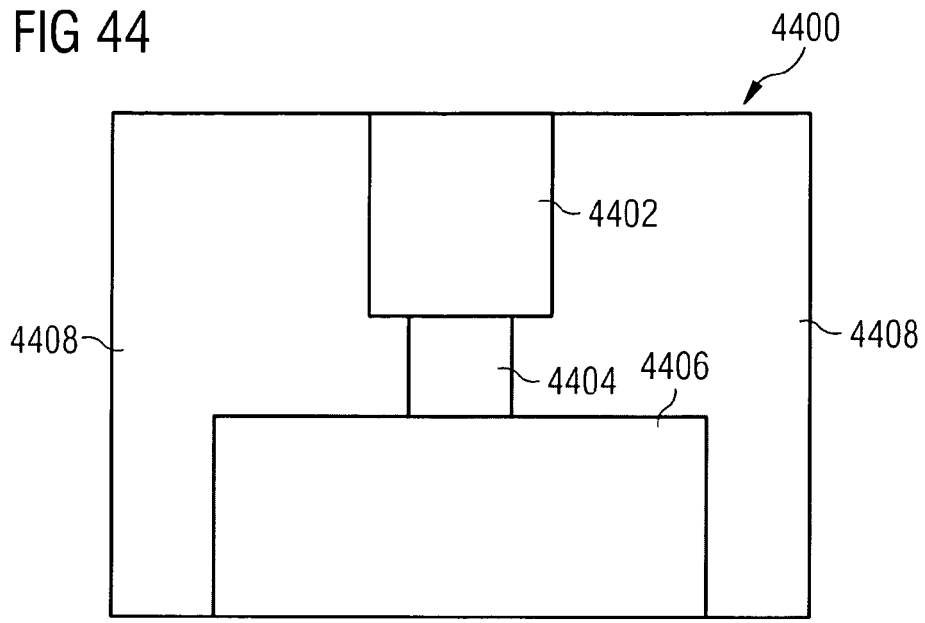
FIG. 44 shows a schematic cross-sectional view of a phase changing memory cell according to one embodiment.

FIG. 44 illustrates a cross-sectional view of an exemplary phase changing memory cell 4400 (active-in-via type). The phase changing memory cell 4400 includes a first electrode 4402, a phase changing material 4404, a second electrode 4406, and an insulating material 4408. The phase changing material 4404 is laterally enclosed by the insulating material 4408. To use the phase changing memory cell, a selection device (not shown), such as a transistor, a diode, or another active device, may be coupled to the first electrode 4402 or to the second electrode 4406 to control the application of a current or a voltage to the phase changing material 4404 via the first electrode 4402 and/or the second electrode 4406. To set the phase changing material 4404 to the crystalline state, a current pulse and/or voltage pulse may be applied to the phase changing material 4404, wherein the pulse parameters are chosen such that the phase changing material 4404 is heated above its crystallization temperature, while keeping the temperature below the melting temperature of the phase changing material 4404. To set the phase changing material 4404 to the amorphous state, a current pulse and/or voltage pulse may be applied to the phase changing material 4404, wherein the pulse parameters are chosen such that the phase changing material 4404 is quickly heated above its melting temperature, and is quickly cooled.

The phase changing material 4404 may include a variety of materials. According to one embodiment, the phase changing material 4404 may include or consist of a chalcogenide alloy that includes one or more elements from group VI of the periodic table. According to another embodiment, the phase changing material 4404 may include or consist of a chalcogenide compound material, such as GeSbTe, SbTe, GeTe or AgInSbTe. According to a further embodiment, the phase changing material 4402 may include or consist of chalcogen free material, such as GeSb, GaSb, InSb, or GeGaInSb. According to still another embodiment, the phase changing material 4404 may include or consist of any suitable material including one or more of the elements Ge, Sb, Te, Ga, Bi, Pb, Sn, Si, P, O, As, In, Se, and S.

According to one embodiment, at least one of the first electrode 4402 and the second electrode 4406 may include or consist of Ti, V, Cr, Zr, Nb, Mo, Hf, Ta, W, or mixtures or alloys thereof. According to another embodiment, at least one of the first electrode 4402 and the second electrode 4406 may include or consist of Ti, V, Cr, Zr, Nb, Mo, Hf, Ta, W and two or more elements selected from the group consisting of B, C, N, O, Al, Si, P, S, and/or mixtures and alloys thereof. Examples of such materials include TiCN, TiAlN, TiSiN, W—$Al_2O_3$ and Cr—$Al_2O_3$.

Figure 45:
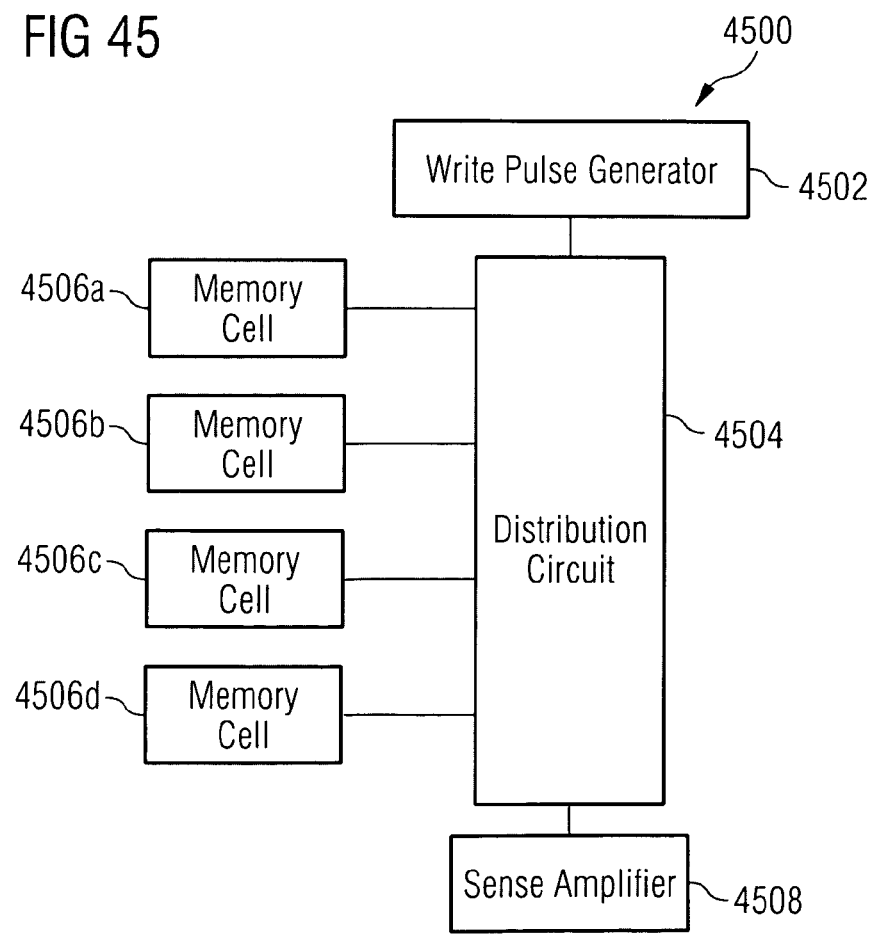
FIG. 45 shows a schematic view of a memory device including resistivity changing memory cells according to one embodiment.

FIG. 45 illustrates a block diagram of a memory device 4500 including a write pulse generator 4502, a distribution circuit 4504, phase changing memory cells 4506a, 4506b, 4506c, 4506d (for example phase changing memory cells 4400 as shown in FIG. 44), and a sense amplifier 4508. According to one embodiment, the write pulse generator 4502 generates current pulses or voltage pulses that are supplied to the phase changing memory cells 4506a, 4506b, 4506c, 4506d via the distribution circuit 4504, thereby programming the memory states of the phase changing memory cells 4506a, 4506b, 4506c, 4506d. According to one embodiment, the distribution circuit 4504 includes a plurality of transistors that supply direct current pulses or direct voltage pulses to the phase changing memory cells 4506a, 4506b, 4506c, 4506d or to heaters being disposed adjacent to the phase changing memory cells 4506a, 4506b, 4506c, 4506d.

As already indicated, the phase changing material of the phase changing memory cells 4506a, 4506b, 4506c, 4506d may be changed from the amorphous state to the crystalline state (or vice versa) under the influence of a temperature change. More generally, the phase changing material may be changed from a first degree of crystallization to a second degree of crystallization (or vice versa) under the influence of a temperature change. For example, a bit value "0" may be assigned to the first (low) degree of crystallization, and a bit value "1" may be assigned to the second (high) degree of crystallization. Since different degrees of crystallization imply different electrical resistances, the sense amplifier 4508 is capable of determining the memory state of one of the phase changing memory cells 4506a, 4506b, 4506c, or 4506d in dependence on the resistance of the phase changing material.

To achieve high memory densities, the phase changing memory cells 4506a, 4506b, 4506c, 4506d may be capable of storing multiple bits of data, i.e., the phase changing material may be programmed to more than two resistance values. For example, if a phase changing memory cell 4506a, 4506b, 4506c, 4506d is programmed to one of three possible resistance levels, 1.5 bits of data per memory cell can be stored. If the phase changing memory cell is programmed to one of four possible resistance levels, two bits of data per memory cell can be stored, and so on.

The embodiment shown in FIG. 45 may also be applied in a similar manner to other types of resistivity changing memory cells like programmable metallization cells (PMCs), magento-resistive memory cells (e.g., MRAMs), organic memory cells (e.g., ORAMs), or transition metal oxide memory cells (TMOs).

Another type of resistivity changing memory cell may be formed using carbon as a resistivity changing material. Generally, amorphous carbon that is rich is $sp^3$-hybridized carbon (i.e., tetrahedrally bonded carbon) has a high resistivity, while amorphous carbon that is rich in $sp^2$-hybridized carbon (i.e., trigonally bonded carbon) has a low resistivity. This difference in resistivity can be used in a resistivity changing memory cell.

In one embodiment, a carbon memory cell may be formed in a manner similar to that described above with reference to phase changing memory cells. A temperature-induced change between an $sp^3$-rich state and an $sp^2$-rich state may be used to change the resistivity of an amorphous carbon material. These differing resistivities may be used to represent different memory states. For example, a high resistance $sp^3$-rich state can be used to represent a "0", and a low resistance $sp^2$-rich state can be used to represent a "1". It will be understood that intermediate resistance states may be used to represent multiple bits, as discussed above.

Generally, in this type of carbon memory cell, application of a first temperature causes a change of high resistivity $sp^3$-rich amorphous carbon to relatively low resistivity $sp^2$-rich amorphous carbon. This conversion can be reversed by application of a second temperature, which is typically higher than the first temperature. As discussed above, these temperatures may be provided, for example, by applying a current and/or voltage pulse to the carbon material. Alternatively, the temperatures can be provided by using a resistive heater that is disposed adjacent to the carbon material.

Another way in which resistivity changes in amorphous carbon can be used to store information is by field-strength induced growth of a conductive path in an insulating amorphous carbon film. For example, applying voltage or current pulses may cause the formation of a conductive $sp^2$ filament in insulating sp³-rich amorphous carbon. The operation of this type of resistive carbon memory is illustrated in FIGS. 46A and 46B.

Figure 46A:
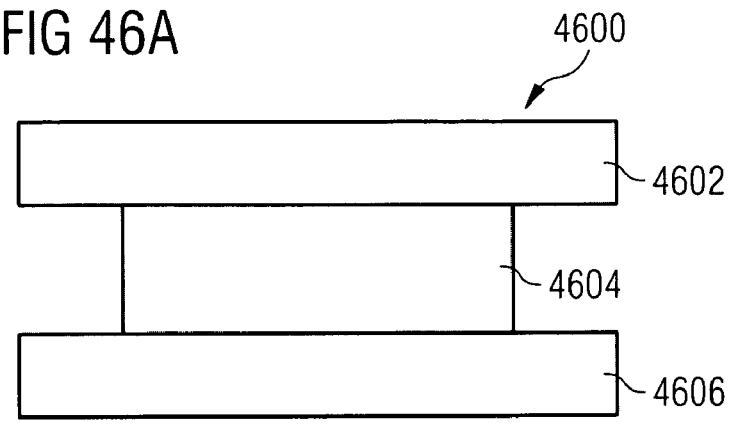
FIG. 46A shows a schematic cross-sectional view of a carbon memory cell in a first memory state according to one embodiment.
Figure 46B:
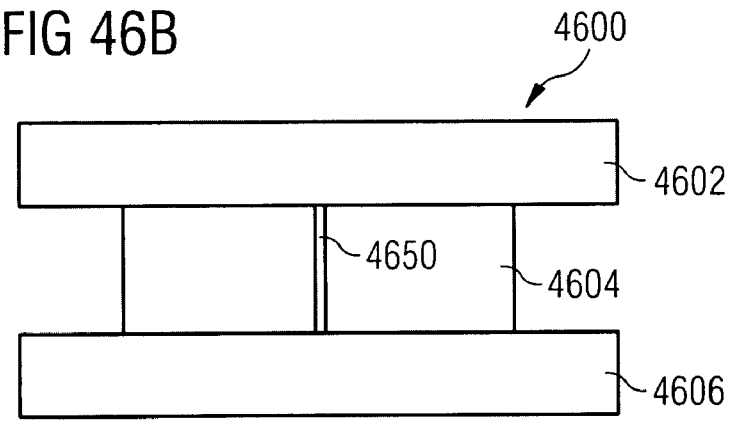
FIG. 46B shows a schematic cross-sectional view of a carbon memory cell in a second memory state according to one embodiment.

FIG. 46A shows a carbon memory cell 4600 that includes a top contact 4602, a carbon storage layer 4604 including an insulating amorphous carbon material rich in sp³-hybridized carbon atoms, and a bottom contact 4606. As shown in FIG. 46B, by forcing a current (or voltage) through the carbon storage layer 4604, an sp² filament 4650 can be formed in the sp³-rich carbon storage layer 4604, changing the resistivity of the memory cell. Application of a current (or voltage) pulse with higher energy (or, in some embodiments, reversed polarity) may destroy the sp² filament 4650, increasing the resistance of the carbon storage layer 4604. As discussed above, these changes in the resistance of the carbon storage layer 4604 can be used to store information, with, for example, a high resistance state representing a "0" and a low resistance state representing a "1". Additionally, in some embodiments, intermediate degrees of filament formation or formation of multiple filaments in the sp³-rich carbon film may be used to provide multiple varying resistivity levels, which may be used to represent multiple bits of information in a carbon memory cell. In some embodiments, alternating layers of sp³-rich carbon and sp²-rich carbon may be used to enhance the formation of conductive filaments through the sp³-rich layers, reducing the current and/or voltage that may be used to write a value to this type of carbon memory.

Figure 47A:
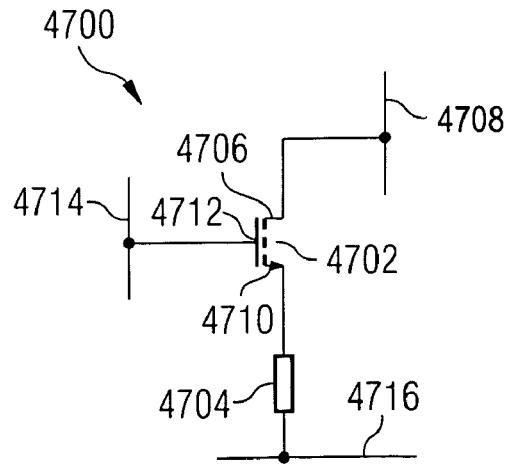
FIG. 47A shows a schematic view of a resistivity changing memory cell according to one embodiment.

Resistivity changing memory cells, such as the phase changing memory cells and carbon memory cells described above, may include a transistor, diode, or other active component for selecting the memory cell. FIG. 47A shows a schematic representation of such a memory cell that uses a resistivity changing memory element. The memory cell 4700 includes a select transistor 4702 and a resistivity changing memory element 4704. The select transistor 4702 includes a source 4706 that is connected to a bit line 4708, a drain 4710 that is connected to the memory element 4704, and a gate 4712 that is connected to a word line 4714. The resistivity changing memory element 4704 also is connected to a common line 4716, which may be connected to ground, or to other circuitry, such as circuitry (not shown) for determining the resistance of the memory cell 4700, for use in reading. Alternatively, in some configurations, circuitry (not shown) for determining the state of the memory cell 4700 during reading may be connected to the bit line 4708. It should be noted that as used herein the terms connected and coupled are intended to include both direct and indirect connection and coupling, respectively.

To write to the memory cell 4700, the word line 4714 is used to select the memory cell 4700, and a current (or voltage) pulse on the bit line 4708 is applied to the resistivity changing memory element 4704, changing the resistance of the resistivity changing memory element 4704. Similarly, when reading the memory cell 4700, the word line 4714 is used to select the cell 4700, and the bit line 4708 is used to apply a reading voltage (or current) across the resistivity changing memory element 4704 to measure the resistance of the resistivity changing memory element 4704.

Figure 47B:
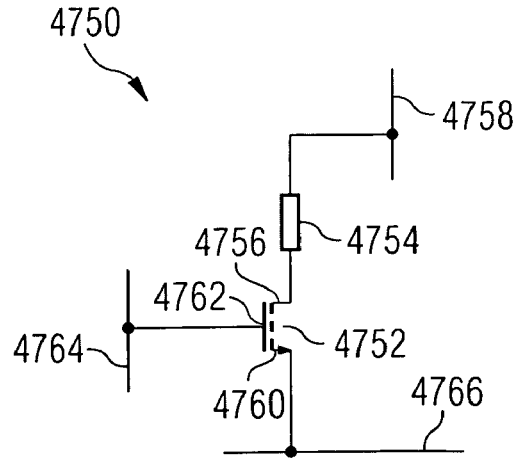
FIG. 47B shows a schematic view of a resistivity changing memory cell according to one embodiment.

The memory cell 4700 may be referred to as a 1T1J cell, because it uses one transistor, and one memory junction (the resistivity changing memory element 4704). Typically, a memory device will include an array of many such cells. It will be understood that other configurations for a 1T1J memory cell, or configurations other than a 1T1J configuration may be used with a resistivity changing memory element. For example, in FIG. 47B, an alternative arrangement for a 1T1J memory cell 4750 is shown, in which a select transistor 4752 and a resistivity changing memory element 4754 have been repositioned with respect to the configuration shown in FIG. 47A. In this alternative configuration, the resistivity changing memory element 4754 is connected to a bit line 4758, and to a source 4756 of the select transistor 4752. A drain 4760 of the select transistor 4752 is connected to a common line 4766, which may be connected to ground, or to other circuitry (not shown), as discussed above. A gate 4762 of the select transistor 4752 is controlled by a word line 4764.

FIG. 1 shows the principle how thermal select magneto-resistive memory cells are operated. FIG. 1 shows a part 100 of an integrated circuit which includes a thermal select magneto-resistive memory element 102 which is connected to a bit line 104 and to mass potential 106, wherein the connection between the memory element 102 and the mass potential 106 includes a select device 108 being connected to a word line 110.

In order to program the memory element 102, a heating current $I_{heat}$ is driven through the memory element 102 via the bit line 104 after having selected the memory cell (i.e., the memory element 102) using the select device 108. The heating current $I_{heat}$ heats the memory element 102 (since the memory element comprises resistive material, e.g., a tunnel barrier for heating) above a particular temperature threshold value. Then, the memory state of the memory element 102 is adjusted using a magnetic field which is generated by a current $I_{field}$ flowing through the bit line 104. The heating of the memory element 102 makes it possible to program the memory state of the memory element 102 using relatively small magnetic fields. After having applied the magnetic field, i.e., after having programmed the memory element 102, the process of driving the heating current $I_{heat}$ through the memory element 102 is terminated, thereby allowing the memory element 102 to cool down again to room temperature.

Figure 2:
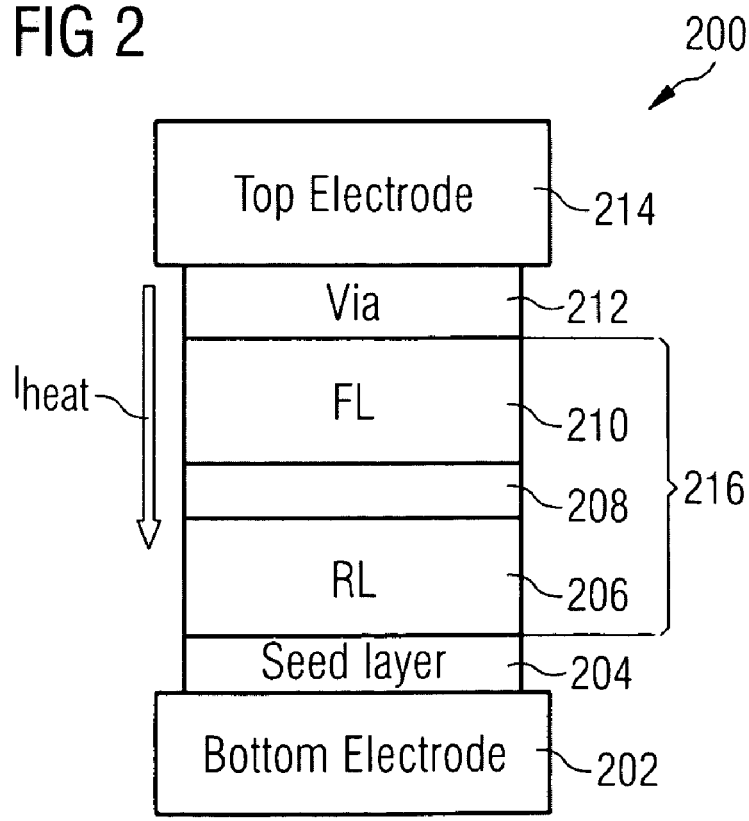
FIG. 2 shows a schematic cross-sectional view of a part of a thermal select magneto-resistive memory cell according to one embodiment.

FIG. 2 shows a possible realization of the thermal select magneto-resistive memory element 102 shown in FIG. 1. The memory element 200 includes a bottom electrode layer 202, a seed layer 204, a reference system layer 206, a signal layer 208, a free layer 210, a via layer 212, and a top electrode layer 214 which are stacked above each other in this order. The reference system layer 206 has a magnetization which is fixed. In contrast, the free layer 210 has a magnetization which can be programmed. In order to program the magnetization of the free layer 210, a heating current $I_{heat}$ is routed between the top electrode layer 214 and the bottom electrode layer 202. The heating current $I_{heat}$ heats the free layer 210 above its blocking temperature. Then, the magnetization of the free layer 210 is programmed using a magnetic field which is generated outside the memory element 200. Since the blocking temperature of the reference system layer 206 is higher than the blocking temperature of the free layer 210, the magnetic field used to program the magnetization of the free layer 210 does not change the magnetization of the reference system layer 206.

The memory element 200 shown in FIG. 2 is usually surrounded by a standard dielectric having only pure thermal isolation properties. As a consequence, a part of the heat generating by the heating current $I_{heat}$ is lost into the dielectric. This means that the time needed for heating the memory cell may be relatively long. Further, it may happen that the blocking temperature of the free layer 210 is not achieved.

Figure 3:
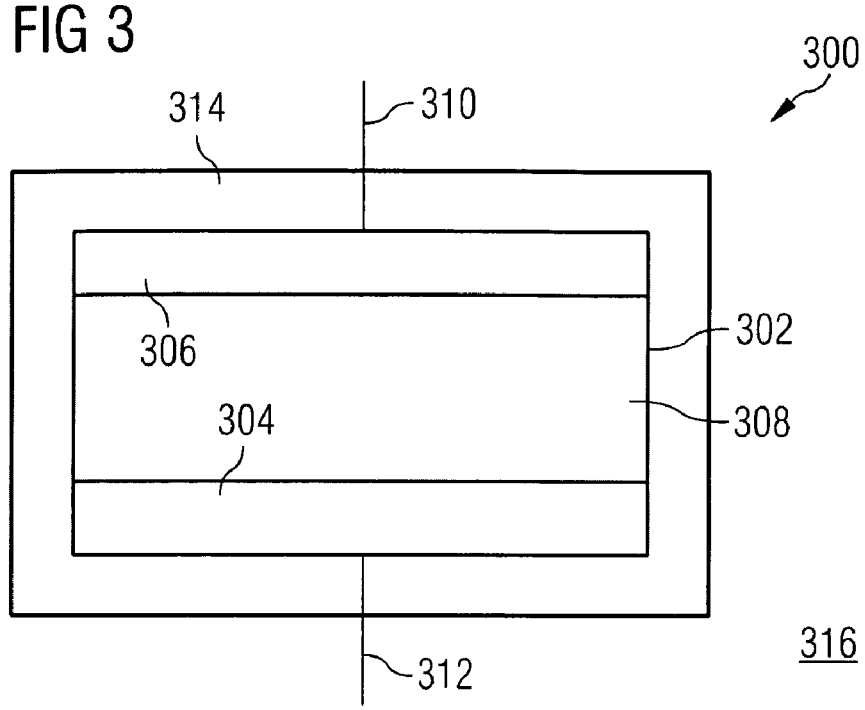
FIG. 3 shows a schematic cross-sectional view of a part of a thermal select magneto-resistive memory cell of an integrated circuit according to one embodiment.

FIG. 3 shows a resistivity changing memory cell 300 which includes a resistivity changing memory element 302. The resistivity changing memory element 302 includes a bottom electrode 304, a top electrode 306, and resistivity changing material 308 being disposed between the bottom electrode 304 and the top electrode 306. The top electrode 306 is contacted by a first conductive line 310, whereas the bottom electrode 304 is contacted by a second conductive line 312. The resistivity changing memory cell 300 further includes a thermal insulating structure 314 which at least partially surrounds the resistivity changing memory element 302.

According to one embodiment of the present invention, the thermal insulating structure 314 is arranged such that the dissipation of heat generated within the resistivity changing memory element 302 into the environment of the resistivity changing memory element 302 (here referenced with reference number 316) is lowered. As a consequence, less power is needed in order to heat the resistivity changing material 308 above the blocking temperature (the temperature above which the memory state of the resistivity changing material 308 is programmable). In this way, the strength of the heating current which is driven through the resistivity changing memory element 302 may be decreased. Alternatively or additionally, the time period during which it is possible to switch the memory state of the resistivity changing memory element 302 may be increased (the cooling down time of the resistivity changing memory element 302 is enlarged). One effect of this embodiment is that more time is available for programming the memory state of the resistivity changing memory element 302 after having terminated the heating current.

If the resistivity changing memory element 302 is a magneto-resistive memory element, the resistivity changing material 308 may, for example, include a free layer and a reference system layer as explained in conjunction with FIG. 2. In case that the resistivity changing memory element 302 is a phase changing memory element, the resistivity changing material 308 may, for example, include a phase changing layer. The area covered/filled by the resistivity changing material 308 may also show other architectures.

Figure 4:
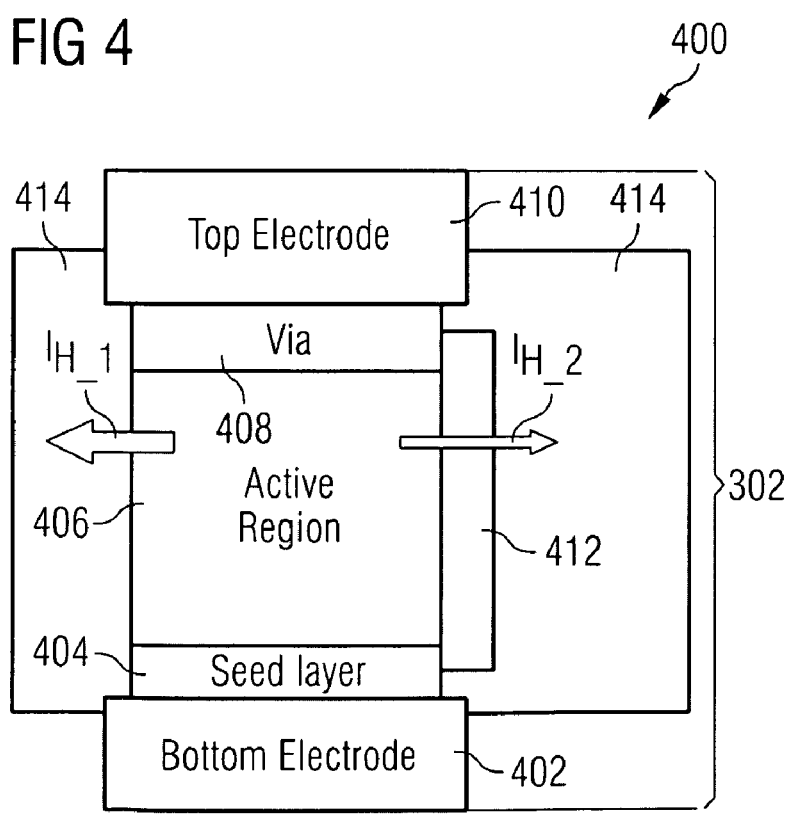
FIG. 4 shows a schematic cross-sectional view of a part of a thermal select magneto-resistive memory cell of an integrated circuit according to one embodiment.

FIG. 4 shows a resistivity changing memory cell 400 having a resistivity changing memory element 302. The resistivity changing memory element 302 includes a bottom electrode layer 402, a seed layer 404, an active region layer 406, a via layer 408, and a top electrode layer 410 which are arranged above each other in this order. The active region layer 406 may, for example, have the same architecture as that of the stack of layers 216 shown in FIG. 2. Inter memory cell area 414 is arranged adjacent the memory element 302 and, in many embodiments, between memory element 302 and other memory elements in the array.

FIG. 4 shows a memory cell 400 in which an isolation layer 412 covers the right side wall of the active region layer 406. In contrast, the left side wall of the active region layer 406 is not covered by an isolation layer. As a consequence, the heat flow $I_{H1}$ which dissipates out of the active region layer 406 through the left side wall of the active region layer 406 is larger than the heat flow $I_{H2}$ which dissipates out of the active region layer 406 through the isolation layer 412. FIG. 4 shows that heat generated within the active region layer 406 (for example, generated by a heating current) can be kept inside the active region layer 406 for a longer period of time if the active region layer 406 is surrounded with thermal insulating structure.

FIG. 5 shows a memory cell 500 including a resistivity changing memory element 504 where the thermal insulating structure surrounding the active region layer 406 is an air gap 502. That is, the air (or vacuum) within the air gap 502 functions as thermal isolator.

FIG. 6 shows a memory cell 600 including a resistivity changing memory element 604 where the air gap 502 shown in FIG. 5 has been filled with porous material 602, i.e., a material including a plurality of voids.

According to one embodiment of the present invention of the invention, the porous material 602 may at least partially be replaced by low-k material.

According to one embodiment of the present invention, the porous material 602 may at least partially be replaced by GST like material which offers low thermal conductivity in its amorphous high resistive state. GST like material may consist of a chalcogenide compound material, such as GeSbTe, SbTe, GeTe or AgInSbTe. According to a further embodiment, the GST like material may include or consist of chalcogen free material, such as GeSb, GaSb, InSb, or GeGaInSb.

According to one embodiment of the present invention, spacer fabrication techniques may be used in order to form the thermal insulating structure 602 shown in FIG. 6.

FIG. 7 shows a memory cell 700 including a resistivity changing memory element 702 where the complete inter memory cell area 414 is filled with thermal insulating material like porous material 602, low-k material, or the like. In this embodiment, it is not necessary to form additional isolation structures in addition to the formation of the inter memory cell area 414 since the material of the complete inter memory cell area 414 already acts as isolation structure.

Figure 8:
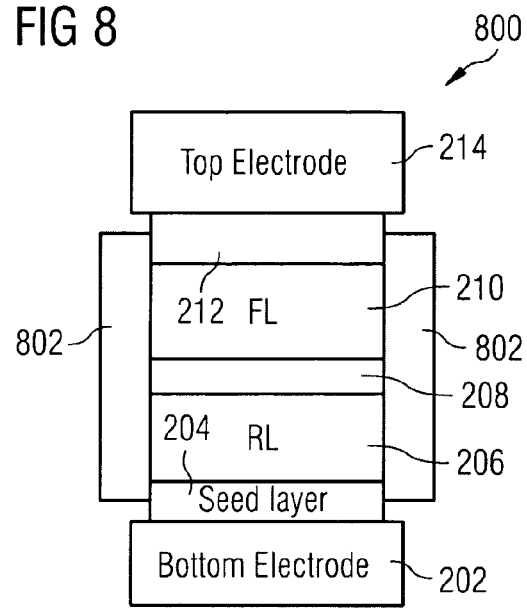
FIG. 8 shows a schematic cross-sectional view of a part of a thermal select magneto-resistive memory cell of an integrated circuit according to one embodiment.

FIG. 8 shows a memory cell 800 including a resistivity changing memory element, the architecture of which corresponds to that of the resistivity changing memory element 200 shown in FIG. 2. However, the memory cell 800 additionally includes a thermal insulating layer 802 which covers the side walls of the free layer 210, the barrier layer 208 and the reference system layer 206. Further, the isolation layer 802 covers parts of the side walls of the via layer 212 and the seed layer 204.

Figure 9A:
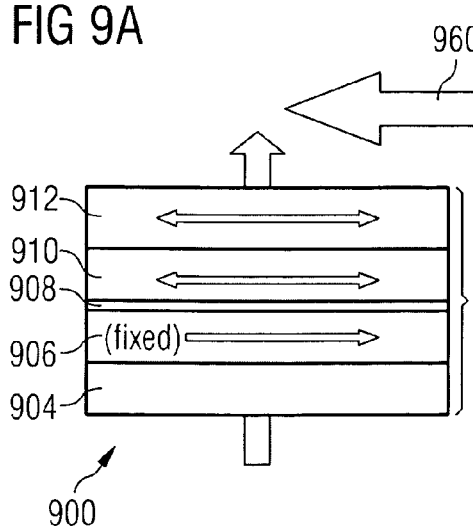
FIG. 9A shows a schematic cross-sectional view of a part of a thermal select magneto-resistive memory cell of an integrated circuit according to one embodiment.

FIG. 9A shows a memory cell 900 including a resistivity changing memory element 902. The resistivity changing memory element 902 includes a natural antiferromagnetic layer 904, a first magnetic layer 906, a barrier layer 908, a second magnetic layer 910, and a second natural antiferromagnetic layer 912 which are arranged above each other in this order. The magnetization of the first magnetic layer 906 is pinned by the magnetization of the first natural antiferromagnetic layer 904. In the same way, the magnetization of the second magnetic layer 910 (free magnetic layer) is pinned by the magnetization of the second natural antiferromagnetic layer 912. In order to switch the magnetization of the free magnetic layer 910 (i.e., in order to program the magneto-resistive memory cell 900), a heating current is driven through the memory cell 900, thereby heating the temperature of second natural antiferromagnetic layer 912 above a blocking temperature. Then, the magnetization of the second natural antiferromagnetic layer 912 is changed, for example, by using an external magnetic field 960. Then, the temperature of the memory cell 900 is cooled down to room temperature. The magnetization of the second magnetic layer 910 (free magnetic layer) will correspond to the direction of the magnetic external field. The second natural antiferromagnetic layer 912 stabilizes the direction of the second magnetic free layer 910 by pinning. The blocking temperature of the first natural antiferromagnetic layer 904 is higher than the blocking temperature of the second natural antiferromagnetic layer 912. In this way, it can be ensured that only the magnetization of the second natural antiferromagnetic layer 912 will be changed by a programming current (external magnetic field) as long as the temperature during the programming of the memory cell 900 is kept below the blocking temperature of the first natural antiferromagnetic layer 904.

Figure 9B:
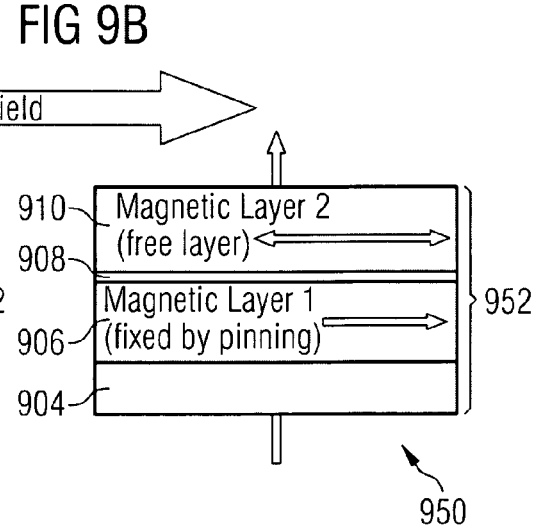
FIG. 9B shows a schematic cross-sectional view of a part of a thermal select magneto resistive memory cell according to one embodiment.

FIG. 9B shows a memory cell 950 including a resistivity changing memory element 952. Compared to the architecture of the memory cell 900, the second natural antiferromagnetic layer 912 has been omitted. In order to program the memory cell 950, an external magnetic field 960 is applied which programs the magnetization of the second magnetic layer 910. No heating process is required to program the memory cell 900, i.e., to set the magnetization of the second magnetic layer 910.

Usually, current densities of $2 \times 10^6$ A/cm$^2$ are needed in order to heat the memory cell 900 for programming. However, due to the isolation structures shown before, the current density can be significantly reduced by a factor 2 to 10 depending of the heat loss ratio of through side walls and contact vias. As a consequence, the power consumption during programming processes of the memory cell 900 can be reduced.

So far, embodiments have been shown where the isolation structure has been provided on side walls of the resistivity changing memory element. However, the isolation structure may also be provided above or below layers of the resistivity changing memory element.

FIG. 10 shows, for example, a memory cell 1000 in which a top electrode 1002 has been provided on the top surface of the second antiferromagnetic layer 912 of a resistivity changing memory element 1008, and in which a bottom electrode 1004 has been provided on the bottom surface of the first antiferromagnetic layer 904 of the resistivity changing memory element 1008. As can be derived from FIG. 10, the lateral positions of the top electrode 1002 and the bottom electrode 1004 are displaced against the antiferromagnetic layers 904, 912 by an offset 1006. One effect of this displacement is that heat flows directed through the top surface of the second natural antiferromagnetic layer 912 are reduced since the contact area between the top electrode 1002 and the second natural antiferromagnetic layer 912 is reduced (the thermal conductivity of the insulating material surrounding resistivity changing memory element 1008 is lower than the thermal conductivity of the top electrode 1002). Nevertheless, the contact area between the top electrode 1002 and the second natural antiferromagnetic layer 912 is large enough to ensure good electrical contact properties. The same holds true in an analogous manner for the bottom electrode 1004 and the bottom surface of the first natural antiferromagnetic layer 904.

FIG. 11 shows a memory cell 1100 having the same architecture as that of the memory cell 1000. However, instead of displacing the top electrode 1002, with respect to a lateral direction, the lateral dimensions of the top electrode 1002 have been reduced. That is, the width 1102 of the electrode 1002 is reduced, compared to the width 1104 of the second natural antiferromagnetic layer 912. This means that the area of the top surface of the second natural antiferromagnetic layer 912 via which heat can be easily transported out of the stack of layers 902 is reduced. The part of the top surface of the second natural antiferromagnetic layer 912 which is not covered by the second electrode 1002 is covered by thermal isolation material 11106.

FIG. 12 shows a memory cell 1200, the architecture of which being similar to that of memory cell 1100. However, the thermal isolation material 1106 has been replaced by conductive material 1002. In analogous manner, the conductive material 1002 has been replaced by insulating material 1106. Also in this case, the top surface area of the second antiferromagnetic layer 912 via which large amounts of heat can be transported out of the stack of layers 902 is reduced, thereby improving the "heat confinement" within the stack of layers 902.

In the following description, making reference to FIGS. 13 to 22, an embodiment of manufacturing a resistivity changing memory cell (here: a magneto-resistive memory cell) will be explained.

Figure 13:
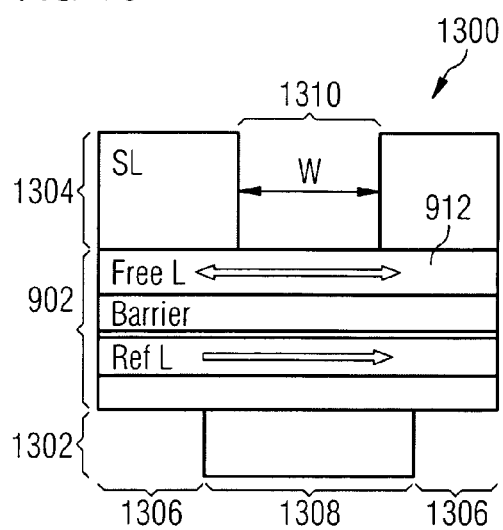
FIG. 13 shows a schematic cross-sectional view of a manufacturing stage of a method of manufacturing an integrated circuit according to one embodiment.

FIG. 13 shows a manufacturing stage 1300 in which a bottom electrode layer 1302, a stack of layers 902 corresponding to the stack of layers shown in FIG. 9A, and a first isolation layer 1304 have been stacked above each other in this order. The bottom electrode layer 1302 includes isolation areas 1306 and conductive areas 1308. The first isolation layer 1304 has been patterned in order to generate a contact hole 1310.

Figure 14:
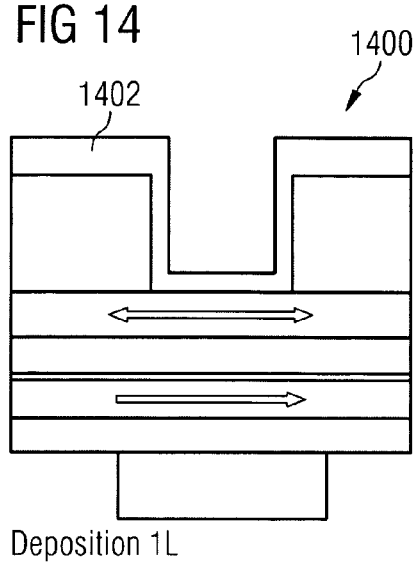
FIG. 14 shows a schematic cross-sectional view of a manufacturing stage of a method of manufacturing an integrated circuit according to one embodiment.

FIG. 14 shows a manufacturing stage 1400 in which a second isolation layer 1402 has been deposited on the top surface of the first isolation layer 1304 and the exposed part of the top surface of the second antiferromagnetic layer 912.

Figure 15:
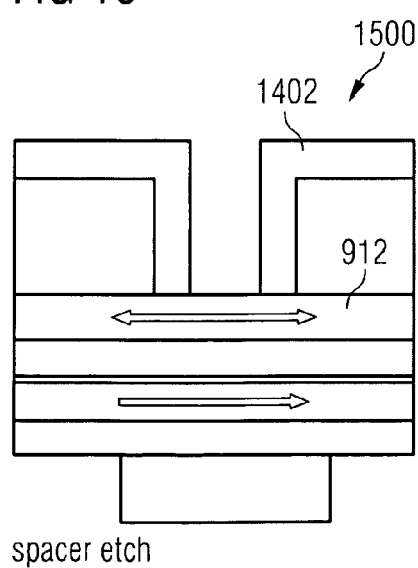
FIG. 15 shows a schematic cross-sectional view of a manufacturing stage of a method of manufacturing an integrated circuit according to one embodiment.

FIG. 15 shows a manufacturing stage 1500 in which a part of the second isolation layer 1402 covering the top surface of the second natural antiferromagnetic layer 912 has been removed. The removal may for example be carried out using an anisotropic etching process.

Figure 16:
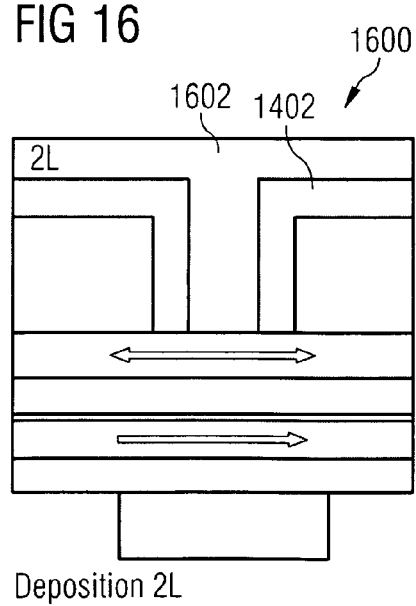
FIG. 16 shows a schematic cross-sectional view of a manufacturing stage of a method of manufacturing an integrated circuit according to one embodiment.

FIG. 16 shows a manufacturing stage 1600 in which a conductive layer 1602 is deposited on the top surface of the second isolation layer 1402 such that the remaining space within the contact hole 1310 is filled.

According to one embodiment of the present invention, the first isolation layer 1304 and the second isolation layer 1402 include or consist of silicon oxide, silicon nitride, amorphous hydrogen doped carbon, polyimide, or a combination of these materials. It should be ensured that the first isolation layer 1304 and the second isolation layer 1402 consist of different materials for selective etching purposes. If the first isolation layer 1304 consists of silicon oxide or organic material, it can be selectively etched to surrounding materials.

According to one embodiment of the present invention, the conductive layer 1602 includes or consists of tungsten, tungsten nitride, tantalum nitride, titanium nitride, and the like.

According to one embodiment of the present invention, the conductive layer 1602 may also consist of insulating material, and the second isolation layer 1402 may consist of conductive material.

Figure 17:
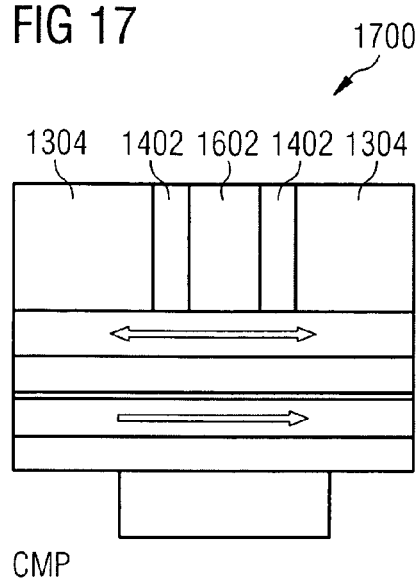
FIG. 17 shows a schematic cross-sectional view of a manufacturing stage of a method of manufacturing an integrated circuit according to one embodiment.

FIG. 17 shows a manufacturing stage 1700 obtained after having subjected the composite structure shown in FIG. 16 to a chemical mechanical polishing (CMP) process. This process is carried out until the top surface of the first isolation layer 1304 is exposed. For this purpose it should be ensured that the material of the first isolation layer 1304 does withstand the CMP process.

Figure 18:
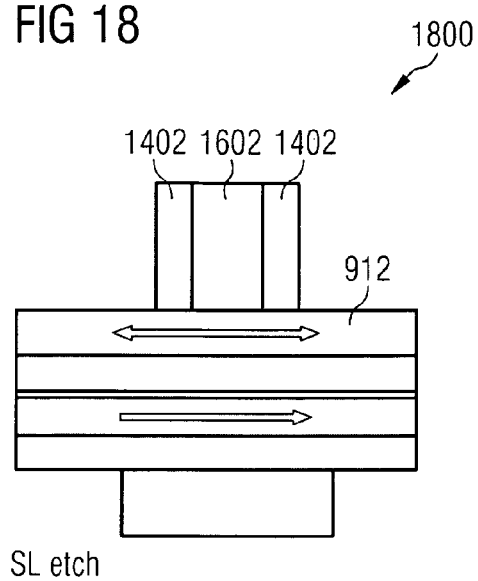
FIG. 18 shows a schematic cross-sectional view of a manufacturing stage of a method of manufacturing an integrated circuit according to one embodiment.

FIG. 18 shows a manufacturing stage 1800 in which the first isolation layer 1304 has been removed using, for example, a selective etching process. In order to easily selectively etch the first isolation layer 1304, the first isolation 1304 may consist of organic material. The etching substance may, for example, be chosen such that the second antiferromagnetic layer 912 can not be etched by the etching substance (more generally, the etching substance may, for example, be chosen such that the free layer 912 (which include more layers than the second antiferromagnetic layer, e.g., an additional cap layer (not shown) or portions of the free layer, e.g., the second natural antiferromagnetic layer, can not be etched by the etching substance).

Figure 19:
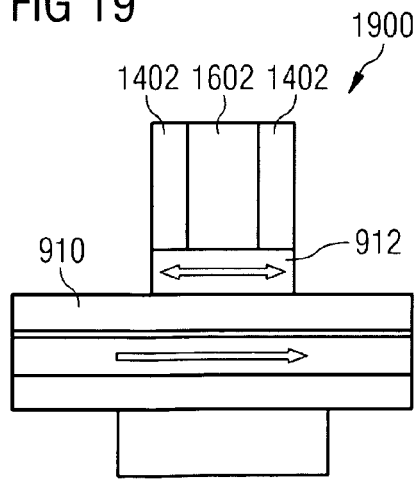
FIG. 19 shows a schematic cross-sectional view of a manufacturing stage of a method of manufacturing an integrated circuit according to one embodiment.

FIG. 19 shows a manufacturing stage 1900 in which the free layer 912 or portion of it is etched using the compound of second isolation layer 1402 and conductive layer 1602 as an etching mask. The etching substance should be chosen such that no etching of the magnetic layer 910 is possible (selective etching).

Figure 20:
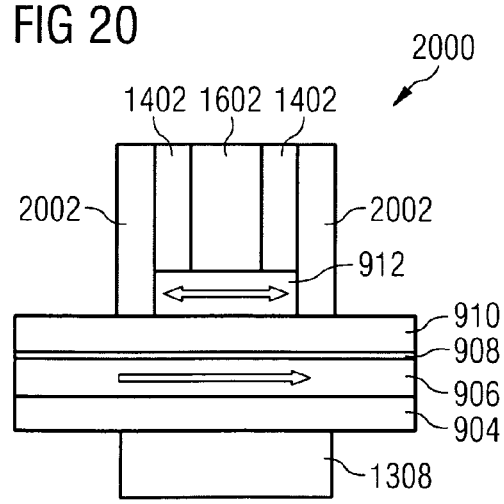
FIG. 20 shows a schematic cross-sectional view of a manufacturing stage of a method of manufacturing an integrated circuit according to one embodiment.

FIG. 20 shows a manufacturing stage 2000 obtained after having deposited a third isolation layer 2002 on the composite structure shown in FIG. 19, and after having patterned the third isolation layer 2002 using an anisotropic patterning process. In this way, side wall spacer (unpatterned parts of the third isolation layer 2002) are manufactured. The patterning process of the third isolation layer 2002 may be carried out using a selective etching substance which does not etch the material of the magnetic layer 910.

Figure 21:
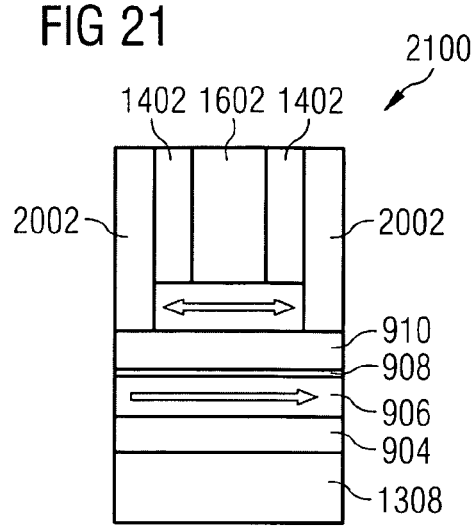
FIG. 21 shows a schematic cross-sectional view of a manufacturing stage of a method of manufacturing an integrated circuit according to one embodiment.

FIG. 21 shows a manufacturing stage 2100 obtained after having patterned the stack of layers 906, 908, and 910 using the compound of side wall spacers, second isolation layer 1402 and conductive layer 1602 as patterning mask.

Figure 22:
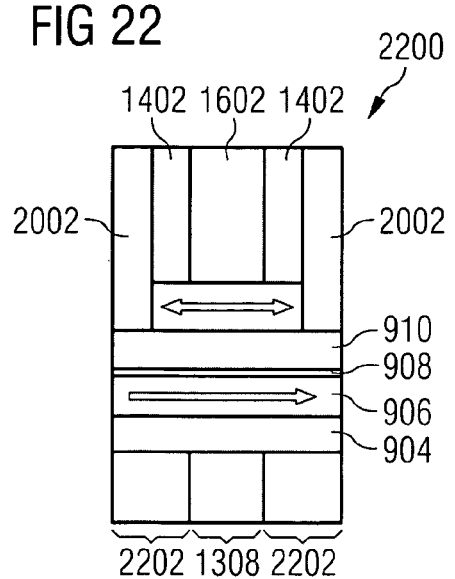
FIG. 22 shows a schematic cross-sectional view of a manufacturing stage of a method of manufacturing an integrated circuit according to one embodiment.

FIG. 22 shows an optional manufacturing stage 2200 obtained after having patterned the conductive part 1308 of the bottom electrode layer 1302 using, for example, an etching process. In this way, the thermal conductivity of the conductive part 1308 is reduced. The patterning of the conductive part 1308 may, for example, be carried out using the same processes as described with respect to the formation of the layers 1402, 1602 (spacer technique). The removed parts of the conductive part 1308 may be filled with non-conductive material 2202. Alternatively, the part referenced by 1308 may be a non conductive pore hole which is smaller than the MTJ dimension. In this case, the areas referenced by 2202 may be conductive areas.

Assuming that the width W of the contact 1310 is F, the spacer technique method shown in FIGS. 13 to 22 enables to form electric contacts (conductive layer 1602) with contact widths being smaller than F, typically down to ~⅓ F.

If the materials of the different layers are chosen suitably, stop-on barrier etching processes (selective etching) may be used.

As has become apparent, the contact used to contact the second natural antiferromagnetic layer 912 is used as part of a hard mask in order to pattern the MTJ (magnetic tunneling junction) stack. The hard mask includes an electrically conductive part (top contact) and an insulating part with low heat conductivity in order to reduce heat losses. It should be mentioned that the method described in conjunction with FIGS. 13 to 22 is a self aligned process. In this way, short circuit problems due to contact hole displacements can be avoided.

In the following description, making reference to FIGS. 23 to 40, a further embodiment of manufacturing a memory cell will be explained.

Figure 23:
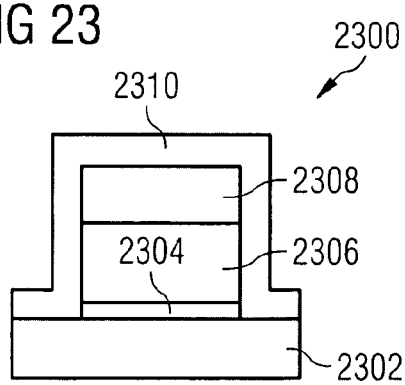
FIG. 23 shows a schematic cross-sectional view of a manufacturing stage of a method of manufacturing an integrated circuit according to one embodiment.

FIG. 23 shows a manufacturing stage 2300 in which a composite structure including a bottom electrode layer 2302, a seed layer 2304, an active material layer 2306, and a top electrode layer 2308 are stacked above each other in this order. Further, a spacer layer 2310 is deposited on this composite structure.

Figure 24:
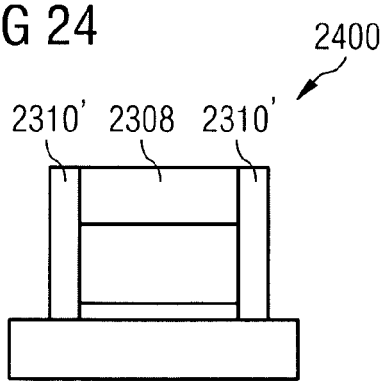
FIG. 24 shows a schematic cross-sectional view of a manufacturing stage of a method of manufacturing an integrated circuit according to one embodiment.

FIG. 24 shows a manufacturing stage 2400 in which an anisotropic etching process is carried out, thereby removing the parts of the spacer material layer located on the top surface of the top electrode layer 2308 and on the top surface of the bottom electrode layer 2302. In this way, spacers 2310' (remaining parts of the spacer layer 2310) are formed which cover the side walls of the top electrode layer 2308, the active material layer 2306 and the seed layer 2304.

Figure 25:
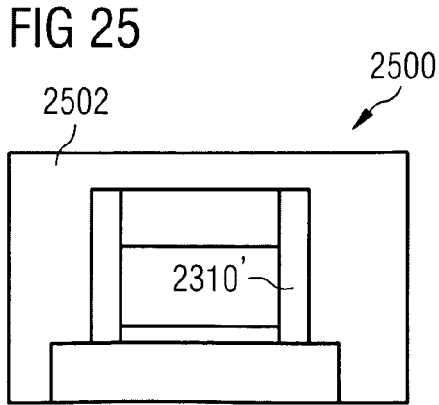
FIG. 25 shows a schematic cross-sectional view of a manufacturing stage of a method of manufacturing an integrated circuit according to one embodiment.

FIG. 25 shows a manufacturing stage 2500 in which an interlayer dielectric (ILD) is deposited such that the composite structure shown in FIG. 24 is encapsulated by the ILD 2502.

Figure 26:
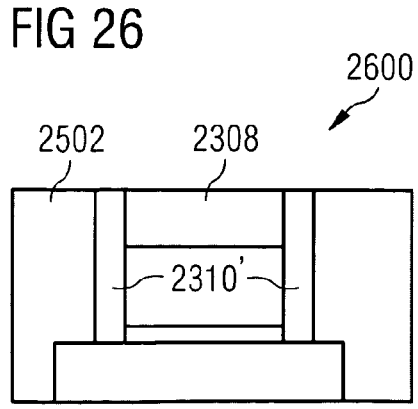
FIG. 26 shows a schematic cross-sectional view of a manufacturing stage of a method of manufacturing an integrated circuit according to one embodiment.

FIG. 26 shows a manufacturing stage 2600 in which the ILD 2502 is etched back until the top surface of the top electrode layer 2308 and the spacer 2310' is exposed. Alternatively or additionally, a chemical mechanical polishing process (CMP process) may be carried out.

FIG. 27 shows a manufacturing stage 2700 obtained after having carried out a selective etching process due to which the spacers 2310' are removed. As a consequence, trenches 2702 are formed between the ILD 2502 and the stack of layers 2304, 2306 and 2308.

FIG. 28 shows a manufacturing stage 2800 obtained by carrying out a non-conformal deposition process of isolation material 2802. The deposition process is carried out until the upper regions of the trenches 2702 are sealed with the isolation material 2802. The deposition of the non-conformal isolation material may, for example, be carried out using a PECVD process (poor step coverage). As a consequence, air gaps 2804 are formed between the ILD 2502 and the stack of layers.

FIG. 29 shows a manufacturing stage 2900 obtained after having deposited further isolation material 2902 (cap layer) with good step coverage properties on the isolation material 2802.

FIG. 30 shows a manufacturing stage 3000 obtained after having carried out a planarization process (CMP process) of the isolation material 2902.

FIG. 31 shows a manufacturing stage 3100 obtained after having formed a contact hole 3102 extending through the isolation layers 2802, 2902, and an ILD layer 3104 deposited on the isolation layer 2902.

In the following description, making reference to FIGS. 32 to 40, a further embodiment of manufacturing a memory cell will be explained.

Figure 32:
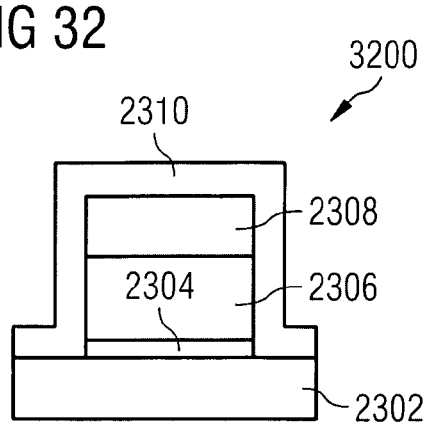
FIG. 32 shows a schematic cross-sectional view of a manufacturing stage of a method of manufacturing an integrated circuit according to one embodiment.

FIG. 32 shows a manufacturing stage 3200 in which a composite structure including a bottom electrode layer 2302, a seed layer 2304, an active material layer 2306, and a top electrode layer 2308 are stacked above each other in this order. Further, a spacer layer 2310 is deposited on this composite structure.

Figure 33:
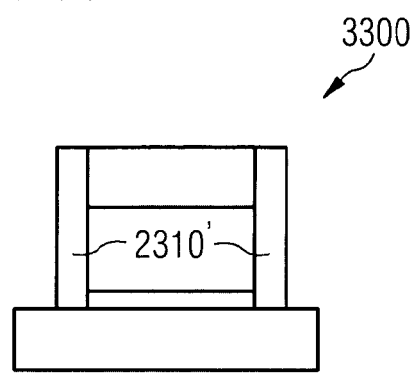
FIG. 33 shows a schematic cross-sectional view of a manufacturing stage of a method of manufacturing an integrated circuit according to one embodiment.

FIG. 33 shows a manufacturing stage 3300 in which an anisotropic etching process is carried out, thereby removing the parts of the spacer material layer located on the top surface of the top electrode layer 2308 and on the top surface of the bottom electrode layer 2302. In this way, spacers 2310' (remaining parts of the spacer layer 2310) are formed which cover the side walls of the top electrode layer 2308, the active material layer 2306 and the seed layer 2304.

Figure 34:
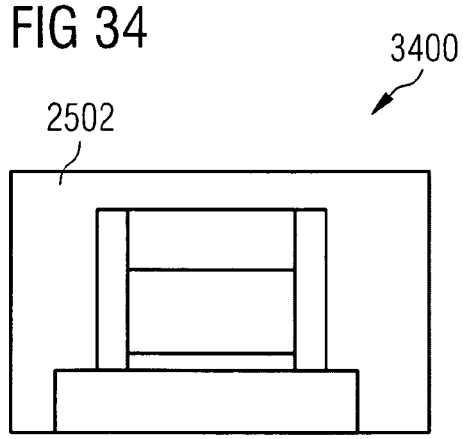
FIG. 34 shows a schematic cross-sectional view of a manufacturing stage of a method of manufacturing an integrated circuit according to one embodiment.

FIG. 34 shows a manufacturing stage 3400 in which an interlayer dielectric (ILD) is deposited such that the composite structure shown in FIG. 33 is encapsulated by the ILD 2502.

Figure 35:
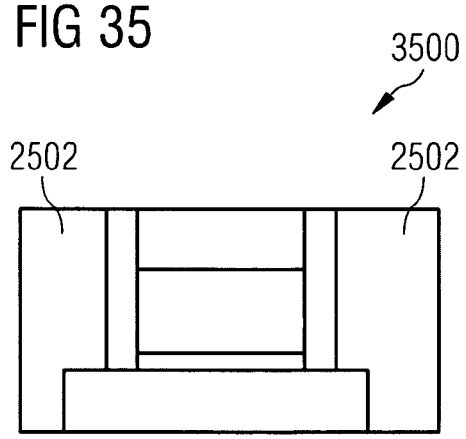
FIG. 35 shows a schematic cross-sectional view of a manufacturing stage of a method of manufacturing an integrated circuit according to one embodiment.

FIG. 35 shows a manufacturing stage 3500 in which the ILD 2502 is etched back until the top surface of the top electrode layer 2308 and the spacer 2310' is exposed. Alternatively or additionally, a chemical mechanical polishing process (CMP process) may be carried out.

FIG. 36 shows a manufacturing stage 3600 obtained after having carried out a selective etching process due to which the spacer 2310' are removed. As a consequence, trenches 2702 are formed between the ILD 2502 and the stack of layers 2304, 2306 and 2308.

FIG. 37 shows a manufacturing stage 3700 obtained after having filled the trenches 2702 with a solvent (liquid) 3702, e.g., isopropyl alcohol (IPA/2-Propanol), acetone or other solvents used to dissolve photo resist.

Then, as shown in the manufacturing stage 3800 of FIG. 38, a sealing layer 3802 (e.g., a IGA polyimide layer) is deposited which seals the trenches 2702. The material of the sealing layer 3802 also fills the upper parts of the trenches 2702 which are not filled by the solvent 3702. The deposition of the sealing layer 3802 may, for example, be carried out using a spin coating process.

FIG. 39 shows a manufacturing stage 3900 in which an annealing process is carried out. The annealing process hardens the sealing layer 3802 and also drives the liquid (solvent) out of the trenches 2702.

FIG. 40 shows a manufacturing stage 4000 obtained after having formed a contact hole 4002 extending through the hardened sealing layer 3802 and an ILD layer 4004 deposited on the sealing layer 3802.

Figure 43A:
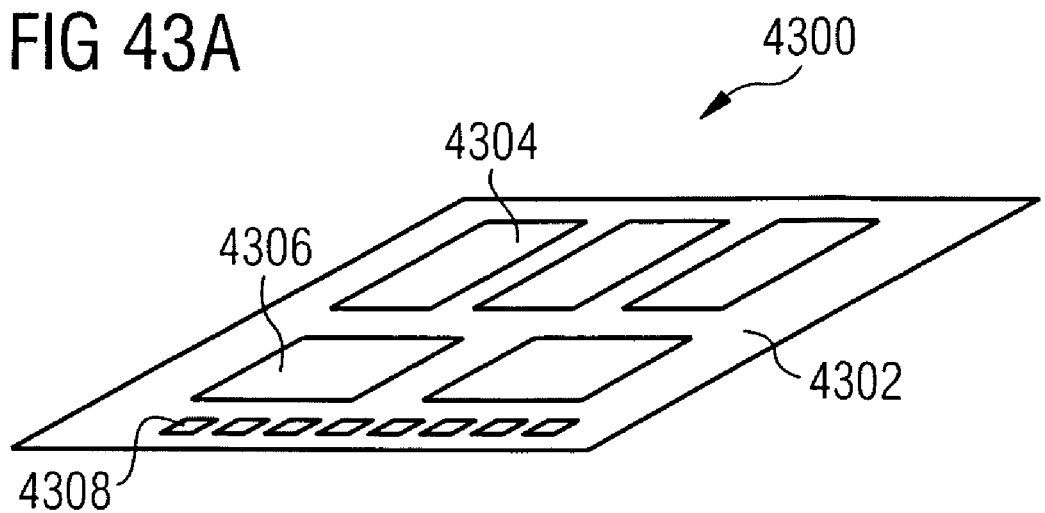
FIG. 43A shows a schematic perspective view of a memory module according to one embodiment.
Figure 43B:
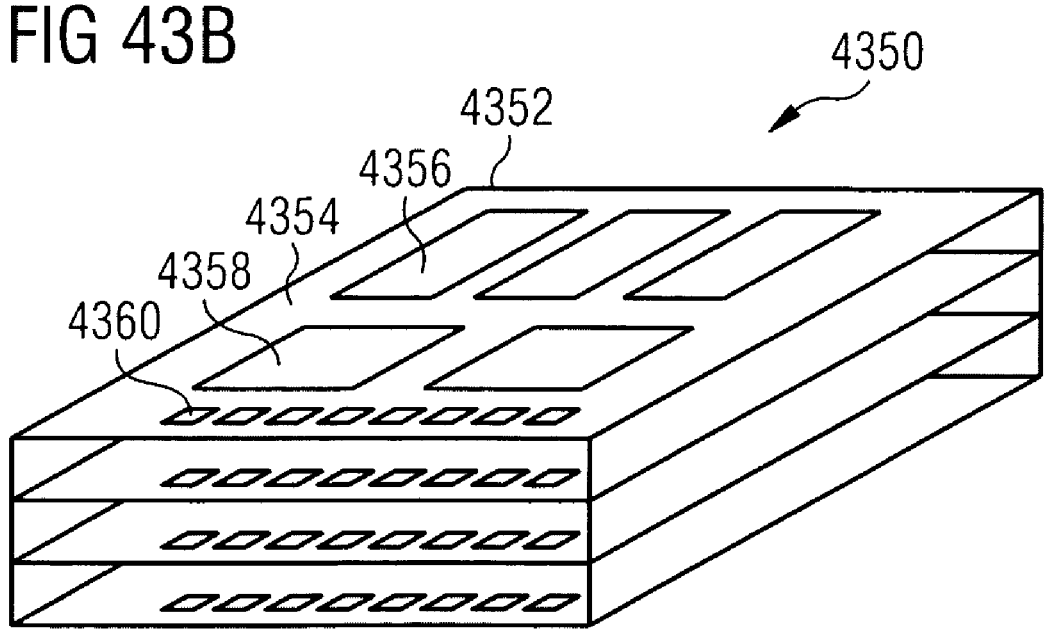
FIG. 43B shows a schematic perspective view of a memory module according to one embodiment.

As shown in FIGS. 43A and 43B, in some embodiments, integrated circuits such as those described herein may be used in modules. In FIG. 43A, a memory module 4300 is shown, on which one or more integrated circuits 4304 are arranged on a substrate 4302. The memory device 4304 may include numerous memory cells, each of which uses a memory element in accordance with an embodiment of the invention. The memory module 4300 may also include one or more electronic devices 4306, which may include memory, processing circuitry, control circuitry, addressing circuitry, bus interconnection circuitry, or other circuitry or electronic devices that may be combined on a module with a memory device, such as the integrated circuit 4304. Additionally, the memory module 4300 includes multiple electrical connections 4308, which may be used to connect the memory module 4300 to other electronic components, including other modules.

As shown in FIG. 43B, in some embodiments, these modules may be stackable, to form a stack 4350. For example, a stackable memory module 4352 may contain one or more integrated circuits 4356, arranged on a stackable substrate 4354. The integrated circuits 4356 contain memory cells that employ memory elements in accordance with an embodiment of the invention. The stackable memory module 4352 may also include one or more electronic devices 4358, which may include memory, processing circuitry, control circuitry, addressing circuitry, bus interconnection circuitry, or other circuitry or electronic devices that may be combined on a module with a memory device, such as the integrated circuits 4356. Electrical connections 4360 are used to connect the stackable memory module 4352 with other modules in the stack 4350, or with other electronic devices. Other modules in the stack 4350 may include additional stackable memory modules, similar to the stackable memory module 4352 described above, or other types of stackable modules, such as stackable processing modules, control modules, communication modules, or other modules containing electronic components.

Although most embodiments have been discussed in the context of the magneto-resistive memory technique, it is to be understood that all embodiments may also be applied to other memory techniques like phase changing memory technique.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising a plurality of memory cells, each memory cell comprising a resistivity changing memory element that comprises a top electrode, a bottom electrode, and resistivity changing material disposed between the top electrode and the bottom electrode, wherein each resistivity changing memory element is at least partially surrounded by a thermal insulating structure, wherein the thermal insulating structures are arranged such that dissipation of heat generated within the resistivity changing memory elements into the environment of the resistivity changing memory elements is lowered as compared with a same structure without the thermal insulating structure, wherein the thermal insulating structures are arranged such that a time period during which a switching of the memory states of the resistivity changing memory elements is possible after having driven heating currents through the resistivity changing memory elements can be increased.

2. The integrated circuit according to claim 1, wherein the resistivity changing memory elements are phase changing memory elements.

3. An integrated circuit comprising a plurality of memory cells, each memory cell comprising a resistivity changing memory element that comprises a top electrode, a bottom electrode, and resistivity changing material disposed between the top electrode and the bottom electrode, wherein each resistivity changing memory element is at least partially surrounded by a thermal insulating structure, wherein the thermal insulating structures are arranged such that dissipation of heat generated within the resistivity changing memory elements into the environment of the resistivity changing memory elements is lowered as compared with a same structure without the thermal insulating structure, wherein lateral dimensions of the top electrodes are lower than lateral dimensions of parts of the resistivity changing memory elements located below the top electrodes, or wherein lateral dimensions of the bottom electrodes are lower than lateral dimensions of parts of the resistivity changing memory elements located above the bottom electrodes.

4. The integrated circuit according to claim 3, wherein the thermal insulating structures cover at least a part of top surfaces of material layers of the resistivity changing memory elements that are contacted by the top electrodes, or cover at least a part of bottom surfaces of material layers of the resistivity changing memory elements that are contacted by the bottom electrodes.

5. The integrated circuit according to claim 4, wherein the thermal insulating structures surround at least a part of side surfaces of the top electrodes, or surround at least a part of side surfaces of the bottom electrodes.

6. The integrated circuit according to claim 3, wherein the lateral dimensions of the top electrodes or of the bottom electrodes are smaller than 1 F.

7. An integrated circuit comprising a plurality of memory cells, each memory cell comprising a resistivity changing memory element that comprises a top electrode, a bottom electrode, and resistivity changing material disposed between the top electrode and the bottom electrode, wherein each resistivity changing memory element is at least partially surrounded by a thermal insulating structure, wherein the thermal insulating structures are arranged such that dissipation of heat generated within the resistivity changing memory elements into the environment of the resistivity changing memory elements is lowered as compared with a same structure without the thermal insulating structure, wherein the resistivity changing memory elements are thermal select magneto-resistive memory elements.

8. The integrated circuit according to claim 3, wherein the resistivity changing memory elements are phase changing memory elements.

9. A method of manufacturing an integrated circuit, the method comprising forming a plurality of memory cells, each memory cell comprising a resistivity changing memory element that comprises a top electrode, a bottom electrode, and resistivity changing material disposed between the top electrode and the bottom electrode, wherein the integrated circuit is manufactured such that each resistivity changing memory element is at least partially surrounded by a thermal insulating structure, wherein the thermal insulating structures are arranged such that dissipation of heat generated within the resistivity changes memory elements into the environment of the resistivity changing memory elements is lowered, wherein forming the memory cells comprises:
- forming a stack of layers comprising a resistivity changing material layer;
- patterning the stack of layers into a plurality of resistivity changing memory element stacks;
- forming a plurality of spacers, each spacer covering side walls of one resistivity changing memory element stack;
- filling the space between different spacers with insulating material; and
- removing the spacers in order to generate trenches between the resistivity changing memory elements and the insulating material, wherein forming the memory cells further comprises:
- filling liquid material into at least lower parts of the trenches;
- filling upper parts of the trenches with trench filling material; and
- carrying out a temperature treatment which causes the liquid material to diffuse out of the trenches.

10. A method of manufacturing an integrated circuit, the method comprising forming a plurality of memory cells, each memory cell comprising a resistivity changing memory element that comprises a top electrode, a bottom electrode, and resistivity changing material disposed between the top electrode and the bottom electrode, wherein the integrated circuit is manufactured such that each resistivity changing memory element is at least partially surrounded by a thermal insulating structure, wherein the thermal insulating structures are arranged such that dissipation of heat generated within the resistivity changing memory elements into the environment of the resistivity changing memory elements is lowered, wherein forming the memory cells comprises:
- forming a stack of layers comprising a resistivity changing material layer;
- forming a sacrificial layer on the stack of layers;
- patterning the sacrificial layer in order to form a contact hole;
- depositing a first layer on a patterned surface of the sacrificial layer;
- removing a part of the first layer covering a top surface of the stack of layers; and
- depositing a second layer on the patterned surface of the sacrificial layer such that the contact hole is filled with second layer material.

11. The method according to claim 10, wherein the first layer comprises an insulating material, and the second layer comprises a conductive material, or vice versa.

12. The method according to claim 11, wherein forming the memory cells further comprises:
- removing the first layer and the second layer until the top surface of the sacrificial layer is exposed;
- removing the sacrificial layer; and
- using the remaining parts of the first layer and the second layer as a mask for patterning the stack of layers.

13. The method according to claim 12, wherein a spacer is formed after having already patterned an upper part of the stack, wherein the spacer covers the side surfaces of the first layer, and wherein the structure thus obtained is used as a mask for patterning the stack of layers which has not been patterned so far.

* * * * *